(12) United States Patent
Choi et al.

(10) Patent No.: US 12,501,750 B2
(45) Date of Patent: Dec. 16, 2025

(54) DISPLAY APPARATUS USING SEMICONDUCTOR LIGHT EMITTING DEVICE AND METHOD FOR MANUFACTURING SAME

(71) Applicant: LG ELECTRONICS INC., Seoul (KR)

(72) Inventors: Hwanjoon Choi, Seoul (KR); Yonghan Lee, Seoul (KR); Taehoon Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 806 days.

(21) Appl. No.: 17/780,202

(22) PCT Filed: Jan. 23, 2020

(86) PCT No.: PCT/KR2020/001181
§ 371 (c)(1),
(2) Date: May 26, 2022

(87) PCT Pub. No.: WO2021/107266
PCT Pub. Date: Jun. 3, 2021

(65) Prior Publication Data
US 2022/0416127 A1    Dec. 29, 2022

(30) Foreign Application Priority Data
Nov. 28, 2019  (KR) .................. 10-2019-0156080

(51) Int. Cl.
*H10H 20/857*  (2025.01)
*H01L 25/075*  (2006.01)
(Continued)

(52) U.S. Cl.
CPC ..... *H10H 20/8312* (2025.01); *H01L 25/0753* (2013.01); *H10H 20/018* (2025.01);
(Continued)

(58) Field of Classification Search
CPC . H10H 20/857; H10H 20/018; H01L 25/0753
See application file for complete search history.

(56) References Cited

U.S. PATENT DOCUMENTS

| 11,189,767 B2* | 11/2021 | Choi | ............... H10H 20/857 |
| 2015/0054008 A1 | 2/2015 | Rhee | |
| 2019/0088168 A1 | 3/2019 | Choi et al. | |

FOREIGN PATENT DOCUMENTS

| EP | 3544386 | 9/2019 |
| KR | 2006-140398 | 6/2006 |

(Continued)

OTHER PUBLICATIONS

European Patent Office Application Serial No. 20892788.9, Search Report dated Nov. 27, 2023, 7 pages.

(Continued)

*Primary Examiner* — Mark V Prenty
(74) *Attorney, Agent, or Firm* — LEE, HONG, DEGERMAN, KANG & WAIMEY

(57) ABSTRACT

The present invention relates to a display apparatus and a method for manufacturing same and, particularly, to a display apparatus using a semiconductor light emitting device having a size of several μm to dozens of μm. The present invention provides a display apparatus comprising: a substrate; a wiring electrode disposed on the substrate; multiple semiconductor light emitting devices electrically connected to the wiring electrode; multiple conductive particles arranged between the wiring electrode and the semiconductor light emitting devices; and a bonding layer disposed on the semiconductor light emitting devices to allow the multiple conductive particles to be fixed to the semiconductor light emitting devices, wherein each of the multiple semiconductor light emitting devices includes multiple conduc- (Continued)

tive electrodes, and the conductive particles are selectively fixed to only the surfaces of the conductive electrodes.

5 Claims, 17 Drawing Sheets

(51) Int. Cl.
  *H10H 20/01* (2025.01)
  *H10H 20/831* (2025.01)
(52) U.S. Cl.
  CPC ......... *H10H 20/857* (2025.01); *H10H 20/032* (2025.01); *H10H 20/0364* (2025.01)

(56) References Cited

FOREIGN PATENT DOCUMENTS

| KR | 10-2018-0055549 | 5/2018 |
| KR | 10-2018-0102424 | 9/2018 |
| KR | 10-2019-0052112 | 5/2019 |
| KR | 10-2019-0057681 | 5/2019 |

OTHER PUBLICATIONS

PCT International Application No. PCT/KR2020/001181, International Search Report dated Aug. 26, 2020, 4 pages.
European Patent Office Application Serial No. 20892788.9, Office Action dated Nov. 13, 2024, 6 pages.

* cited by examiner

DISPLAY APPARATUS USING SEMICONDUCTOR LIGHT EMITTING DEVICE AND METHOD FOR MANUFACTURING SAME

CROSS-REFERENCE TO RELATED APPLICATIONS

This application is the National Stage filing under 35 U.S.C. 371 of International Application No. PCT/KR2020/001181, filed on Jan. 23, 2020, which claims the benefit of earlier filing date and right of priority to Korean Application No. 10-2019-0156080, filed on Nov. 28, 2019, the contents of which are all hereby incorporated by reference herein their entirety.

TECHNICAL FIELD

The present disclosure relates to a display apparatus and a method of manufacturing the same, and more particularly, to a display apparatus using a semiconductor light emitting device having a size of several micrometers to several tens of micrometers.

BACKGROUND ART

In recent years, display apparatuses having excellent characteristics such as low profile, flexibility and the like have been developed in the field of display technology. On the contrary, currently commercialized major displays are represented by liquid crystal displays (LCDs) and active matrix organic light emitting diodes (AMOLEDs).

On the other hand, light emitting diodes (LEDs) are well known light emitting devices for converting an electrical current to light, and have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a flexible display, thereby presenting a scheme for solving the problems.

The semiconductor light emitting device is transferred onto a substrate in various ways. As one of methods of transferring semiconductor light emitting devices, a transfer method using an anisotropic conductive layer is used. The use of an anisotropic conductive layer has an advantage capable of electrically connecting a semiconductor light emitting device and a wiring electrode only by thermal compression, but there is a problem that a contact failure between the semiconductor light emitting device and the wiring electrode occurs when an area of a wiring substrate is increased.

DISCLOSURE OF INVENTION

Technical Problem

An aspect of the present disclosure is to provide a structure for preventing the occurrence of a contact failure between a semiconductor light emitting device and a wiring electrode when the semiconductor light emitting device is pressed to the wiring electrode using an anisotropic conductive layer, and a manufacturing method thereof.

Solution to Problem

In order to achieve the foregoing objectives, the present disclosure provides a display apparatus including a substrate, a wiring electrode disposed on the substrate, a plurality of semiconductor light emitting devices electrically connected to the wiring electrode, a plurality of conductive particles disposed between the wire electrode and the semiconductor light emitting devices, and an adhesive layer disposed on the semiconductor light emitting device to fix the plurality of conductive particles to the semiconductor light emitting device, wherein each of the plurality of semiconductor light emitting devices comprises a plurality of conductive electrodes, and the conductive particles are selectively fixed only to surfaces of the conductive electrodes.

According to an embodiment, the adhesive layer may be selectively disposed only on surfaces of the conductive electrodes.

According to an embodiment, a plurality of adhesive layers spaced apart from each other may be disposed on a surface of each of the plurality of conductive electrodes, and at least one conductive particle may be fixed to each of the adhesive layers.

According to an embodiment, the adhesive layer may be disposed on a surface of the conductive electrode and a surface of the semiconductor light emitting device that is not covered with the conductive electrode.

According to an embodiment, an adhesion of a region disposed on the surface of the conductive electrode over an entire region of the adhesive layer may be greater than that of a region disposed on the surface of the semiconductor light emitting device that is not covered with the conductive electrode.

According to an embodiment, a viscosity of a region disposed on a surface of the conductive electrode over an entire region of the adhesive layer may be less than that of a region disposed on the surface of the semiconductor light emitting device that is not covered with the conductive electrode.

In addition, the present disclosure provides a method of manufacturing a display apparatus, and the method may include forming a semiconductor light emitting device on a growth substrate, forming a conductive electrode on a surface of the semiconductor light emitting device, forming an adhesive layer on the semiconductor light emitting device, applying a plurality of conductive particles on the adhesive layer, pressing the semiconductor light emitting device to a substrate provided with a wiring substrate, and removing the growth substrate, wherein the conductive particles are selectively fixed only to a surface of the conductive electrode.

According to an embodiment, the forming of an adhesive layer on the semiconductor light emitting device may be performed such that the adhesive layer is selectively formed only on the surface of the conductive electrode.

According to an embodiment, the forming of an adhesive layer on the semiconductor light emitting device may include forming an adhesive layer on a surface of the conductive electrode and a surface of the semiconductor light emitting device that is not covered with the conductive electrode, and selectively irradiating light to only a portion of the adhesive layer to cure the portion of the adhesive layer.

According to an embodiment, the selectively irradiating light only to a portion of the adhesive layer may include selectively irradiating light only to the adhesive layer formed on the surface of the semiconductor light emitting device that is not covered with the conductive electrode.

Advantageous Effects of Invention

In a display apparatus according to the present disclosure, when a semiconductor light emitting device is pressed onto a wiring substrate, the flow of conductive particles may be minimized, thereby preventing the conductive particles from being released between the semiconductor light emitting device and a wiring electrode. Through this, the present disclosure may prevent a contact failure between the semiconductor light emitting device and the wiring electrode.

MODE FOR THE INVENTION

Figure 1:
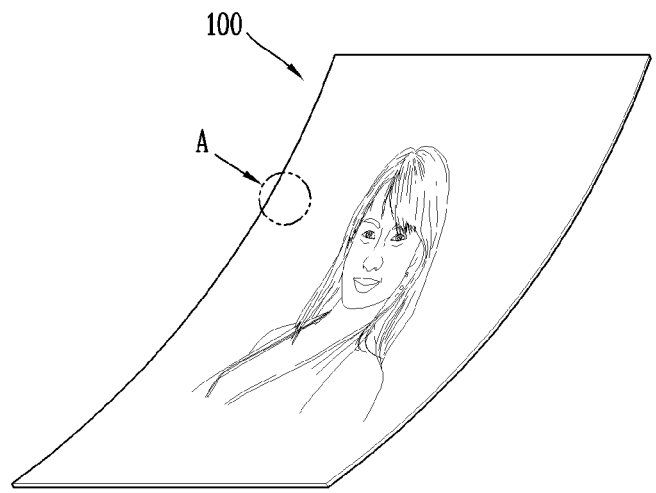
FIG. 1 is a conceptual view showing a display apparatus using a semiconductor light emitting device according to an embodiment of the present disclosure.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing an embodiment disclosed herein, moreover, the detailed description will be omitted when specific description for publicly known technologies to which the invention pertains is judged to obscure the gist of the present disclosure. Also, it should be noted that the accompanying drawings are merely illustrated to easily explain the concept of the invention, and therefore, they should not be construed to limit the technological concept disclosed herein by the accompanying drawings.

Furthermore, it will be understood that when an element such as a layer, region or substrate is referred to as being "on" another element, it can be directly on the another element or an intermediate element may also be interposed therebetween.

A display apparatus disclosed herein may include a portable phone, a smart phone, a laptop computer, a digital broadcast terminal, a personal digital assistant (PDA), a portable multimedia player (PMP), a navigation, a slate PC, a tablet PC, an ultrabook, a digital TV, a desktop computer, and the like. However, it would be easily understood by those skilled in the art that a configuration disclosed herein may be applicable to any displayable device even though it is a new product type which will be developed later.

FIG. 1 is a conceptual view showing a display apparatus using a semiconductor light emitting device according to an embodiment of the present disclosure.

According to the drawing, information processed in the controller of the display apparatus 100 may be displayed using a flexible display.

The flexible display may include a flexible, bendable, twistable, foldable and rollable display. For example, the flexible display may be a display fabricated on a thin and flexible substrate that can be warped, bent, folded or rolled like a paper sheet while maintaining the display characteristics of a flat display in the related art.

A display area of the flexible display becomes a plane in a configuration that the flexible display is not warped (for example, a configuration having an infinite radius of curvature, hereinafter, referred to as a "first configuration"). The display area thereof becomes a curved surface in a configuration that the flexible display is warped by an external force in the first configuration (for example, a configuration having a finite radius of curvature, hereinafter, referred to as a "second configuration"). As illustrated, information displayed in the second configuration may be visual information displayed on a curved surface. The visual information may be realized in such a manner that a light emission of each unit pixel (sub-pixel) arranged in a matrix configuration is controlled independently. The sub-pixel denotes a minimum unit for implementing one color.

The sub-pixel of the flexible display may be implemented by a semiconductor light emitting device. According to the present disclosure, a light emitting diode (LED) is illustrated as a type of semiconductor light emitting device. The light emitting diode may be formed with a small size to perform the role of a sub-pixel even in the second configuration through this.

Hereinafter, a flexible display implemented using the light emitting diode will be described in more detail with reference to the accompanying drawings.

Figure 2:
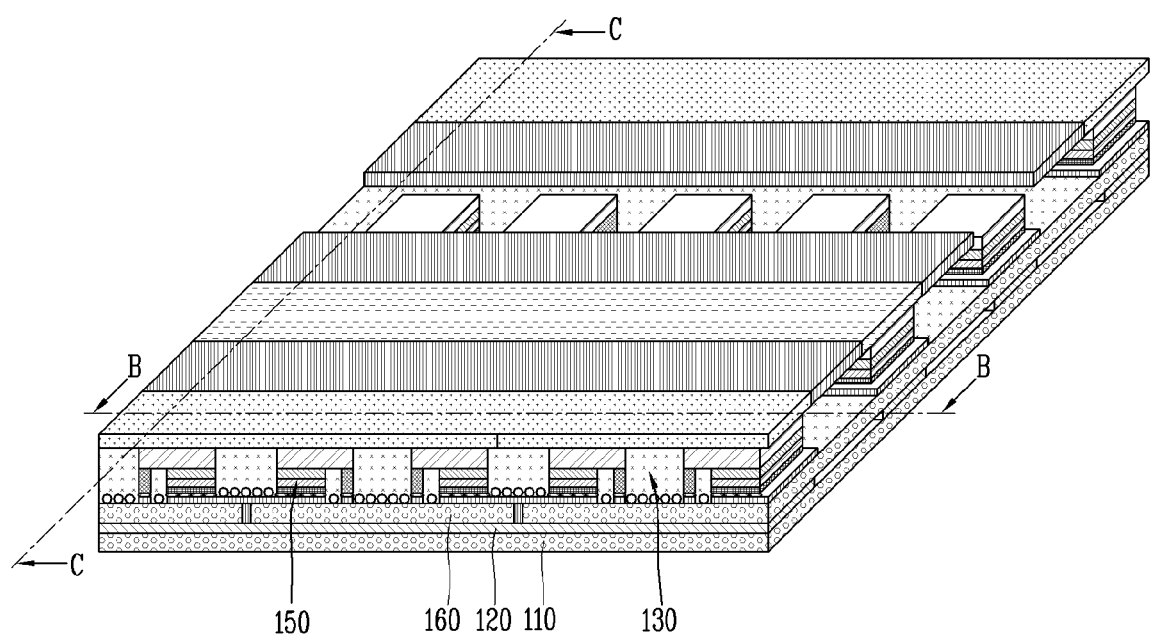
FIG. 2 is a partial enlarged view of portion A in FIG. 1, and FIGS. 3A and 3B are cross-sectional views taken along lines B-B and C-C in FIG. 2.
Figure 3A:
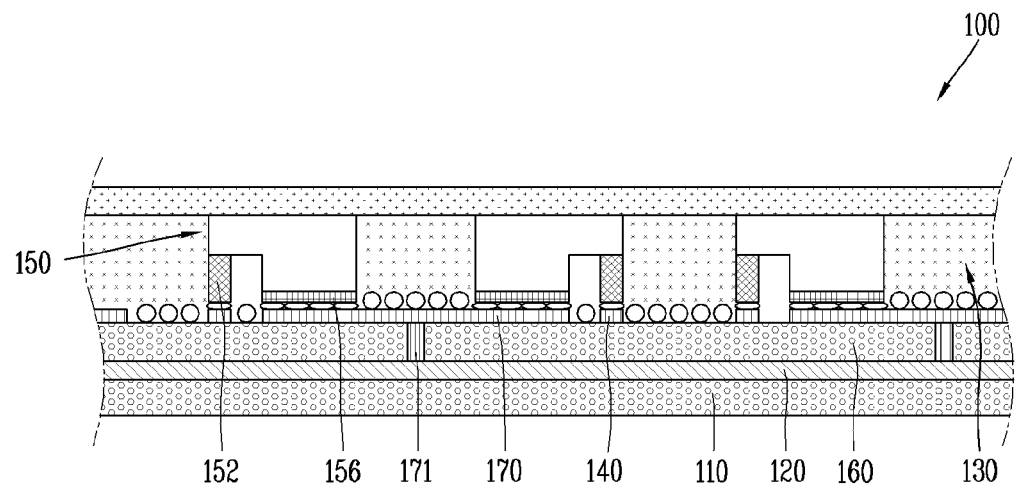
Figure 3B:
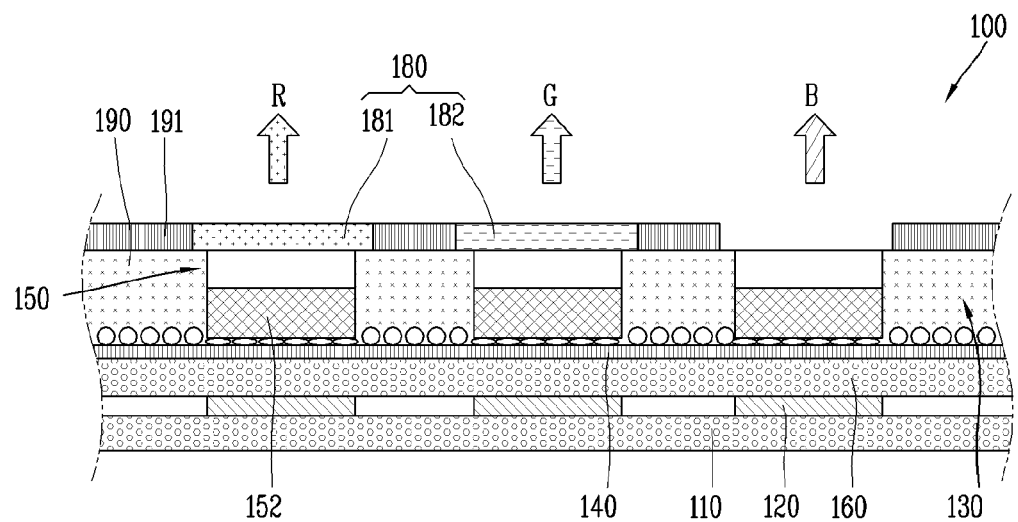
Figure 4:
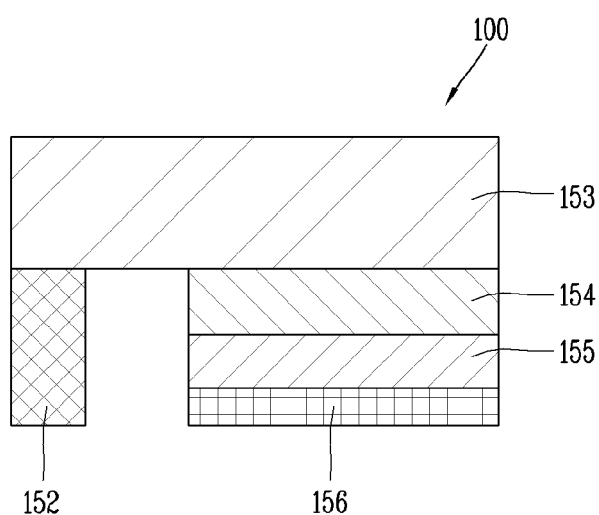
FIG. 4 is a conceptual view showing a flip-chip type semiconductor light emitting device in FIG. 3.

FIG. 2 is a partial enlarged view of portion A in FIG. 1, FIGS. 3A and 3B are cross-sectional views taken along lines B-B and C-C in FIG. 2, FIG. 4 is a conceptual view showing a flip-chip type semiconductor light emitting device in FIG. 3A, and FIGS. 5A to 5C are conceptual views showing various forms for implementing colors in connection with a flip-chip type semiconductor light emitting device.

According to the drawings in FIGS. 2, 3A and 3B, there is illustrated a display apparatus 100 using a passive matrix (PM) type semiconductor light emitting device as a display apparatus 100 using a semiconductor light emitting device. However, an example described below may also be applicable to an active matrix (AM) type semiconductor light emitting device.

The display apparatus 100 may include a substrate 110, a first electrode 120, a conductive adhesive layer 130, a second electrode 140, and a plurality of semiconductor light emitting devices 150.

The substrate 110 may be a flexible substrate. The substrate 110 may contain glass or polyimide (PI) to implement the flexible display apparatus. In addition, if it is an insulating and flexible material, any one such as polyethylene naphthalate (PEN), polyethylene terephthalate (PET) or the like may be used. Furthermore, the substrate 110 may be either one of transparent and non-transparent materials.

The substrate 110 may be a wiring substrate disposed with the first electrode 120, and thus the first electrode 120 may be placed on the substrate 110.

According to the drawing, an insulating layer 160 may be disposed on the substrate 110 placed with the first electrode 120, and an auxiliary electrode 170 may be placed on the insulating layer 160. In this case, a configuration in which the insulating layer 160 is deposited on the substrate 110 may be single wiring substrate. More specifically, the insulating layer 160 may be incorporated into the substrate 110 with an insulating and flexible material such as polyimide (PI), PET, PEN or the like to form single wiring substrate.

The auxiliary electrode 170 as an electrode for electrically connecting the first electrode 120 to the semiconductor light emitting device 150 is placed on the insulating layer 160, and disposed to correspond to the location of the first electrode 120. For example, the auxiliary electrode 170 has a dot shape, and may be electrically connected to the first electrode 120 by means of an electrode hole 171 passing through the insulating layer 160. The electrode hole 171 may be formed by filling a conductive material in a via hole.

Referring to the drawings, the conductive adhesive layer 130 may be formed on one surface of the insulating layer 160, but the present disclosure may not be necessarily limited to this. For example, it may be possible to also have a structure in which the conductive adhesive layer 130 is disposed on the substrate 110 with no insulating layer 160. The conductive adhesive layer 130 may perform the role of an insulating layer in the structure in which the conductive adhesive layer 130 is disposed on the substrate 110.

The conductive adhesive layer 130 may be a layer having adhesiveness and conductivity, and to this end, a conductive material and an adhesive material may be mixed on the conductive adhesive layer 130. Furthermore, the conductive adhesive layer 130 may have flexibility, thereby allowing a flexible function in the display apparatus.

For such an example, the conductive adhesive layer 130 may be an anisotropic conductive film (ACF), an anisotropic conductive paste, a solution containing conductive particles, and the like. The conductive adhesive layer 130 may allow electrical interconnection in the z-direction passing through the thickness thereof, but may be configured as a layer having electrical insulation in the horizontal x-y direction thereof. Accordingly, the conductive adhesive layer 130 may be referred to as a z-axis conductive layer (however, hereinafter referred to as a "conductive adhesive layer").

The anisotropic conductive film is a film with a form in which an anisotropic conductive medium is mixed with an insulating base member, and thus when heat and pressure are applied thereto, only a specific portion thereof may have conductivity by means of the anisotropic conductive medium. Hereinafter, heat and pressure are applied to the anisotropic conductive film, but other methods may be also available for the anisotropic conductive film to partially have conductivity. The methods may include applying only either one of heat and pressure thereto, UV curing, and the like.

Furthermore, the anisotropic conductive medium may be conductive balls or particles. According to the drawing, in this example, the anisotropic conductive film is a film with a form in which an anisotropic conductive medium is mixed with an insulating base member, and thus when heat and pressure are applied thereto, only a specific portion thereof may have conductivity by means of the conductive balls. The anisotropic conductive film may be in a state in which a core with a conductive material contains a plurality of particles coated by an insulating layer with a polymer material, and in this case, it may have conductivity by means of the core while breaking an insulating layer on a portion to which heat and pressure are applied. Here, a core may be transformed to implement a layer having both surfaces to which objects contact in the thickness direction of the film. For a more specific example, heat and pressure are applied to an anisotropic conductive film as a whole, and electrical connection in the z-axis direction is partially formed by a height difference from a mating object adhered by the use of the anisotropic conductive film.

For another example, an anisotropic conductive film may be in a state containing a plurality of particles in which a conductive material is coated on insulating cores. In this case, a portion to which heat and pressure are applied may be converted (pressed and adhered) to a conductive material to have conductivity in the thickness direction of the film. For still another example, it may be formed to have conductivity in the thickness direction of the film in which a conductive material passes through an insulating base member in the z-direction. In this case, the conductive material may have a pointed end portion.

According to the drawing, the anisotropic conductive film may be a fixed array anisotropic conductive film (ACF) configured with a form in which conductive balls are inserted into one surface of the insulating base member. More specifically, the insulating base member is formed of an adhesive material, and the conductive balls are intensively disposed at a bottom portion of the insulating base member, and when heat and pressure are applied thereto, the base member is modified along with the conductive balls, thereby having conductivity in the vertical direction thereof.

However, the present disclosure may not be necessarily limited to this, and the anisotropic conductive film may be all allowed to have a form in which conductive balls are randomly mixed with an insulating base member or a form configured with a plurality of layers in which conductive balls are disposed at any one layer (double-ACF), and the like.

The anisotropic conductive paste as a form coupled to a paste and conductive balls may be a paste in which conductive balls are mixed with an insulating and adhesive base material. Furthermore, a solution containing conductive particles may be a solution in a form containing conductive particles or nano particles.

Referring again to the drawing, the second electrode 140 is located at the insulating layer 160 to be separated from the auxiliary electrode 170. In other words, the conductive adhesive layer 130 is disposed on the insulating layer 160 located with the auxiliary electrode 170 and second electrode 140.

When the conductive adhesive layer 130 is formed in a state that the auxiliary electrode 170 and second electrode 140 are located, and then the semiconductor light emitting device 150 is connect thereto in a flip-chip form with the application of heat and pressure, the semiconductor light emitting device 150 is electrically connected to the first electrode 120 and second electrode 140.

Referring to FIG. 4, the semiconductor light emitting device may be a flip-chip type semiconductor light emitting device.

For example, the semiconductor light emitting device may include a p-type electrode 156, a p-type semiconductor layer 155 formed with the p-type electrode 156, an active layer 154 formed on the p-type semiconductor layer 155, an n-type semiconductor layer 153 formed on the active layer 154, and an n-type electrode 152 disposed to be separated from the p-type electrode 156 in the horizontal direction on the n-type semiconductor layer 153. In this case, the p-type electrode 156 may be electrically connected to the welding portion 179 by the conductive adhesive layer 130, and the n-type electrode 152 may be electrically connected to the second electrode 140.

Referring to FIGS. 2, 3A and 3B again, the auxiliary electrode 170 may be formed in an elongated manner in one direction to be electrically connected to a plurality of semiconductor light emitting devices 150. For example, the left and right p-type electrodes of the semiconductor light emitting devices around the auxiliary electrode may be electrically connected to one auxiliary electrode.

More specifically, the semiconductor light emitting device 150 is pressed into the conductive adhesive layer 130, and through this, only a portion between the p-type electrode 156 and auxiliary electrode 170 of the semiconductor light emitting device 150 and a portion between the n-type electrode 152 and second electrode 140 of the semiconductor light emitting device 150 have conductivity, and the remaining portion does not have conductivity since there is no push-down of the semiconductor light emitting device. As described above, the conductive adhesive layer 130 may form an electrical connection as well as allow a mutual coupling between the semiconductor light emitting device 150 and the auxiliary electrode 170 and between the semiconductor light emitting device 150 and the second electrode 140.

Furthermore, a plurality of semiconductor light emitting devices 150 constitute a light emitting array, and a phosphor layer 180 is formed on the light emitting array.

The light emitting device array may include a plurality of semiconductor light emitting devices with different self-luminance values. Each of the semiconductor light emitting devices 150 constitutes a sub-pixel, and is electrically connected to the first electrode 120. For example, there may exist a plurality of first electrodes 120, and the semiconductor light emitting devices are arranged in several rows, for instance, and each row of the semiconductor light emitting devices may be electrically connected to any one of the plurality of first electrodes.

Furthermore, the semiconductor light emitting devices may be connected in a flip-chip form, and thus semiconductor light emitting devices grown on a transparent dielectric substrate. Furthermore, the semiconductor light emitting devices may be nitride semiconductor light emitting devices, for instance. The semiconductor light emitting device 150 may have excellent luminance characteristics, and thus it may be possible to configure individual sub-pixels even with a small size thereof.

According to the drawing, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

Furthermore, when the base member of the anisotropic conductive film is black, the partition wall 190 may have reflective characteristics while at the same time increasing contrast with no additional black insulator.

For another example, a reflective partition wall may be separately provided with the partition wall 190. In this case, the partition wall 190 may include a black or white insulator according to the purpose of the display apparatus. When a partition wall of a white insulator is used, an effect of enhancing reflectivity may be obtained. When a partition wall of a black insulator is used, a contrast ratio may be increased while having a reflection characteristic.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs a function of converting the blue (B) light into the color of a sub-pixel. The phosphor layer 180 may be a red phosphor layer 181 or green phosphor layer 182 constituting individual pixels.

In other words, a red phosphor 181 capable of converting blue light into red (R) light may be deposited on the blue semiconductor light emitting device 151 at a position implementing a red sub-pixel, and a green phosphor 182 capable of converting blue light into green (G) light may be deposited on the blue semiconductor light emitting device 151 at a position implementing a green sub-pixel. Furthermore, only the blue semiconductor light emitting device 151 may be solely used at a location implementing a blue sub-pixel. In this case, the red (R), green (G) and blue (B) sub-pixels may implement one pixel. More specifically, one color phosphor may be deposited along each line of the first electrode 120. Accordingly, one line on the first electrode 120 may be an electrode controlling one color. In other words, red (R), green (B) and blue (B) may be sequentially disposed along the second electrode 140, thereby implementing sub-pixels.

However, the present disclosure may not be necessarily limited to this, and the semiconductor light emitting device 150 may be combined with a quantum dot (QD) instead of a phosphor to implement sub-pixels such as red (R), green (G) and blue (B).

Furthermore, a black matrix 191 may be disposed between each phosphor layer to enhance contrast. In other words, the black matrix 191 can enhance the contrast of luminance.

However, the present disclosure may not be necessarily limited to this, and another structure for implementing blue, red and green may be also applicable thereto.

Figure 5A:
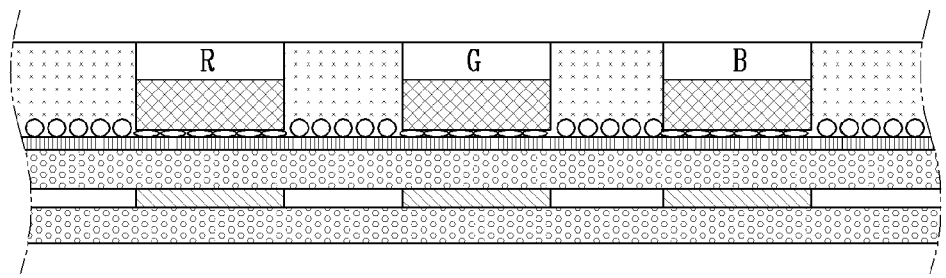
FIGS. 5A to 5C are conceptual views showing various forms for implementing colors in connection with a flip-chip type semiconductor light emitting device.

Referring to FIG. 5A, each of the semiconductor light emitting devices 150 may be implemented with a high-power light emitting device that emits various lights including blue in which gallium nitride (GaN) is mostly used, and indium (In) and or aluminum (Al) are added thereto.

In this case, the semiconductor light emitting device 150 may be red, green and blue semiconductor light emitting devices, respectively, to implement each sub-pixel. For instance, red, green and blue semiconductor light emitting devices (R, G, B) are alternately disposed, and red, green and blue sub-pixels implement one pixel by means of the red, green and blue semiconductor light emitting devices, thereby implementing a full color display.

Figure 5B:
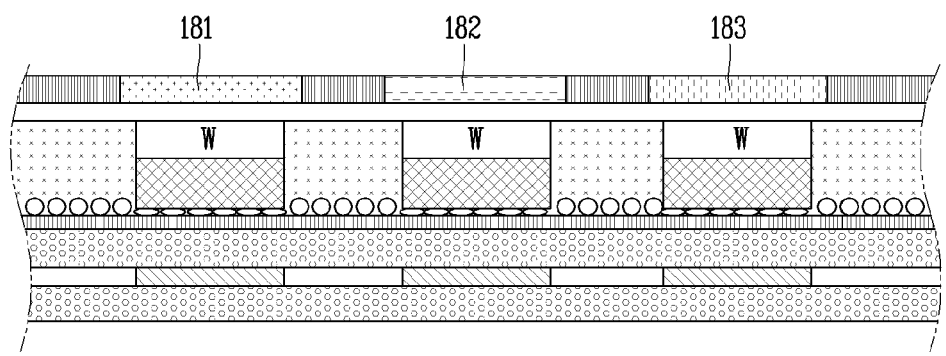

Referring to FIG. 5B, the semiconductor light emitting device may have a white light emitting device (W) provided with a yellow phosphor layer for each element. In this case, a red phosphor layer 181, a green phosphor layer 182 and blue phosphor layer 183 may be provided on the white light emitting device (W) to implement a sub-pixel. Furthermore, a color filter repeated with red, green and blue on the white light emitting device (W) may be used to implement a sub-pixel.

Figure 5C:
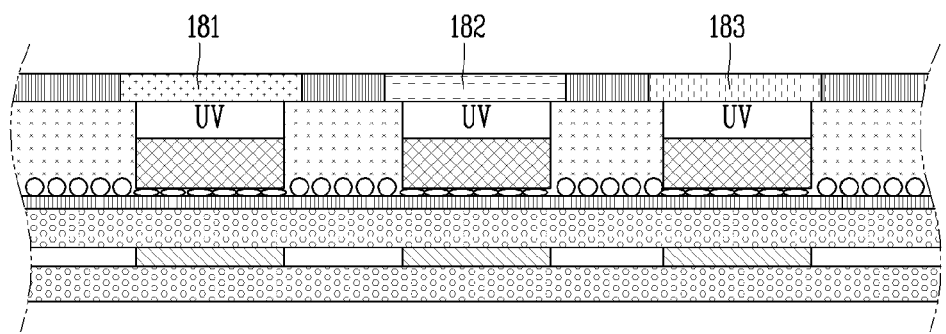

Referring to FIG. 5C, it may be possible to also have a structure in which a red phosphor layer 181, a green phosphor layer 182 and blue phosphor layer 183 may be provided on a ultra violet light emitting device (UV). In this manner, the semiconductor light emitting device can be used over the entire region up to ultra violet (UV) as well as visible light, and may be extended to a form of semiconductor light emitting device in which ultra violet (UV) can be used as an excitation source.

Taking the present example into consideration again, the semiconductor light emitting device 150 is placed on the conductive adhesive layer 130 to configure a sub-pixel in the display apparatus. The semiconductor light emitting device 150 may have excellent luminance characteristics, and thus it may be possible to configure individual sub-pixels even with a small size thereof. A size of an individual semiconductor light emitting device 150 may have a side length of 80 μm or less, and may be a rectangular or square device. In case of a rectangular shaped element, the size thereof may be less than 20×80 μm.

Furthermore, even when a square shaped semiconductor light emitting device 150 with a length of side of 10 μm is used for a sub-pixel, it will exhibit a sufficient brightness for implementing a display apparatus. Accordingly, for example, in case of a rectangular pixel in which one side of a sub-pixel is 600 μm in size, and the remaining one side thereof is 300 μm, a relative distance between the semiconductor light emitting devices becomes sufficiently large. Accordingly, in this case, it may be possible to implement a flexible display apparatus having a HD image quality.

A display apparatus using the foregoing semiconductor light emitting device will be manufactured by a new type of manufacturing method. Hereinafter, the manufacturing method will be described with reference to FIG. 6.

Figure 6:
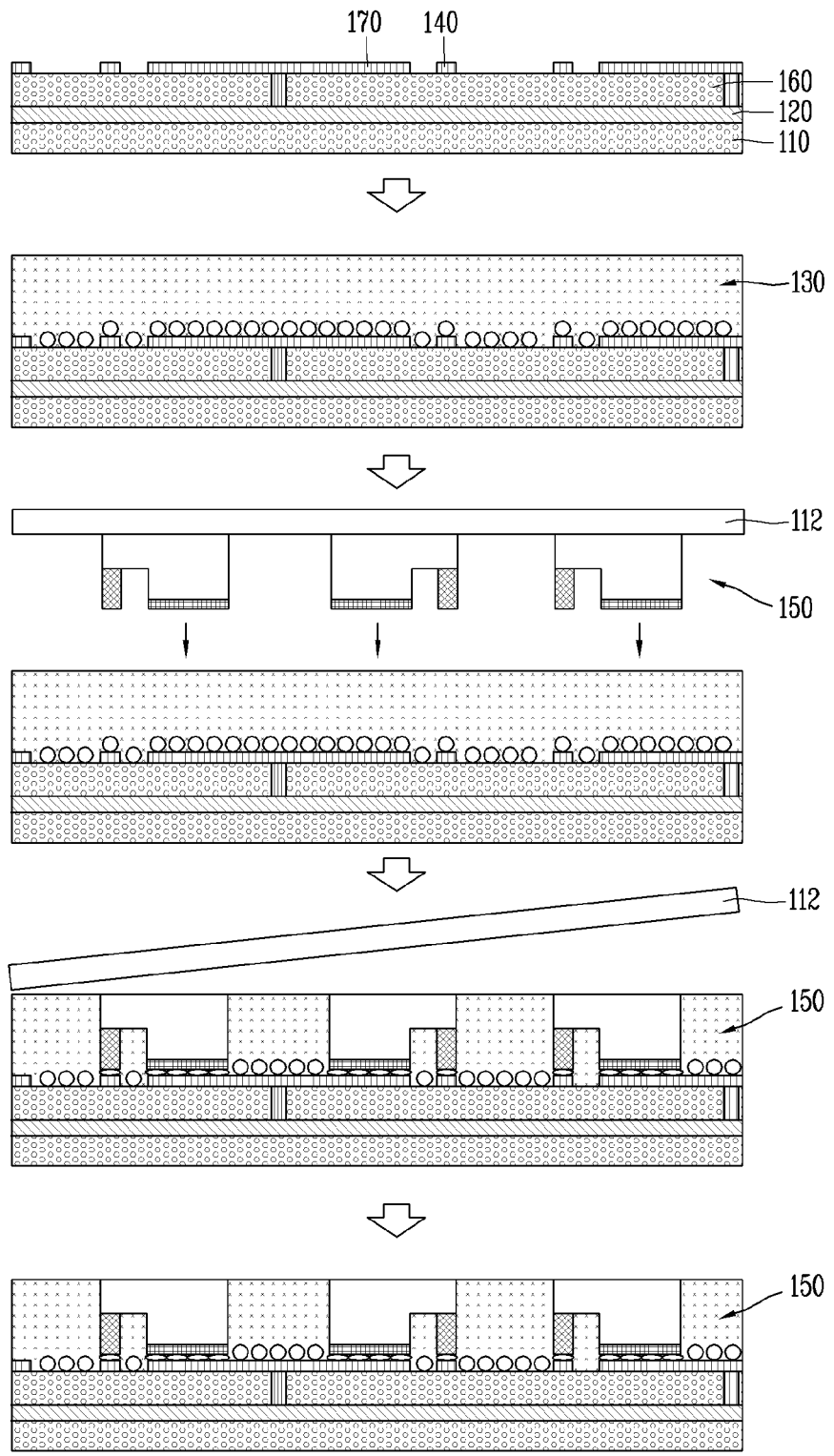
FIG. 6 is cross-sectional views showing a method of manufacturing a display apparatus using a semiconductor light emitting device of the present disclosure.

FIG. 6 is cross-sectional views showing a method of manufacturing a display apparatus using a semiconductor light emitting device of the present disclosure.

Referring to the drawing, first, the conductive adhesive layer 130 is formed on the insulating layer 160 located with the auxiliary electrode 170 and second electrode 140. The insulating layer 160 is deposited on the first substrate 110 to form one substrate (or wiring substrate), and the first electrode 120, auxiliary electrode 170 and second electrode 140 are disposed at the wiring substrate. In this case, the first electrode 120 and second electrode 140 may be disposed in a perpendicular direction to each other. Furthermore, the first substrate 110 and insulating layer 160 may contain glass or polyimide (PI), respectively, to implement a flexible display apparatus.

The conductive adhesive layer 130 may be implemented by an anisotropic conductive film, for example, and to this end, an anisotropic conductive film may be coated on a substrate located with the insulating layer 160.

Next, a second substrate 112 located with a plurality of semiconductor light emitting devices 150 corresponding to the location of the auxiliary electrodes 170 and second electrodes 140 and constituting individual pixels is disposed such that the semiconductor light emitting device 150 faces the auxiliary electrode 170 and second electrode 140.

In this case, the second substrate 112 as a growth substrate for growing the semiconductor light emitting device 150 may be a sapphire substrate or silicon substrate.

The semiconductor light emitting device may have a gap and size capable of implementing a display apparatus when formed in the unit of wafer, and thus effectively used for a display apparatus.

Next, the wiring substrate is thermally compressed to the second substrate 112. For example, the wiring substrate and second substrate 112 may be thermally compressed to each other by applying an ACF press head. The wiring substrate and second substrate 112 are bonded to each other using the thermal compression. Only a portion between the semiconductor light emitting device 150 and the auxiliary electrode 170 and second electrode 140 may have conductivity due to the characteristics of an anisotropic conductive film having conductivity by thermal compression, thereby allowing the electrodes and semiconductor light emitting device 150 to be electrically connected to each other. At this time, the semiconductor light emitting device 150 may be inserted into the anisotropic conductive film, thereby forming a partition wall between the semiconductor light emitting devices 150.

Next, the second substrate 112 is removed. For example, the second substrate 112 may be removed using a laser lift-off (LLO) or chemical lift-off (CLO) method.

Finally, the second substrate 112 is removed to expose the semiconductor light emitting devices 150 to the outside. Silicon oxide ($SiO_x$) or the like may be coated on the wiring substrate coupled to the semiconductor light emitting device 150 to form a transparent insulating layer (not shown).

Furthermore, the method may further include placing a phosphor layer on one surface of the semiconductor light emitting device 150. For example, the semiconductor light emitting device 150 may be a blue semiconductor light emitting device for emitting blue (B) light, and red or green phosphor for converting the blue (B) light into the color of the sub-pixel may form a layer on one surface of the blue semiconductor light emitting device.

The manufacturing method or structure of a display apparatus using the foregoing semiconductor light emitting device may be modified in various forms. For such an example, the foregoing display apparatus may be applicable to a vertical semiconductor light emitting device. Hereinafter, the vertical structure will be described with reference to FIGS. 5 and 6.

Furthermore, according to the following modified example or embodiment, the same or similar reference numerals are designated to the same or similar configurations to the foregoing example, and the description thereof will be substituted by the earlier description.

Figure 7:
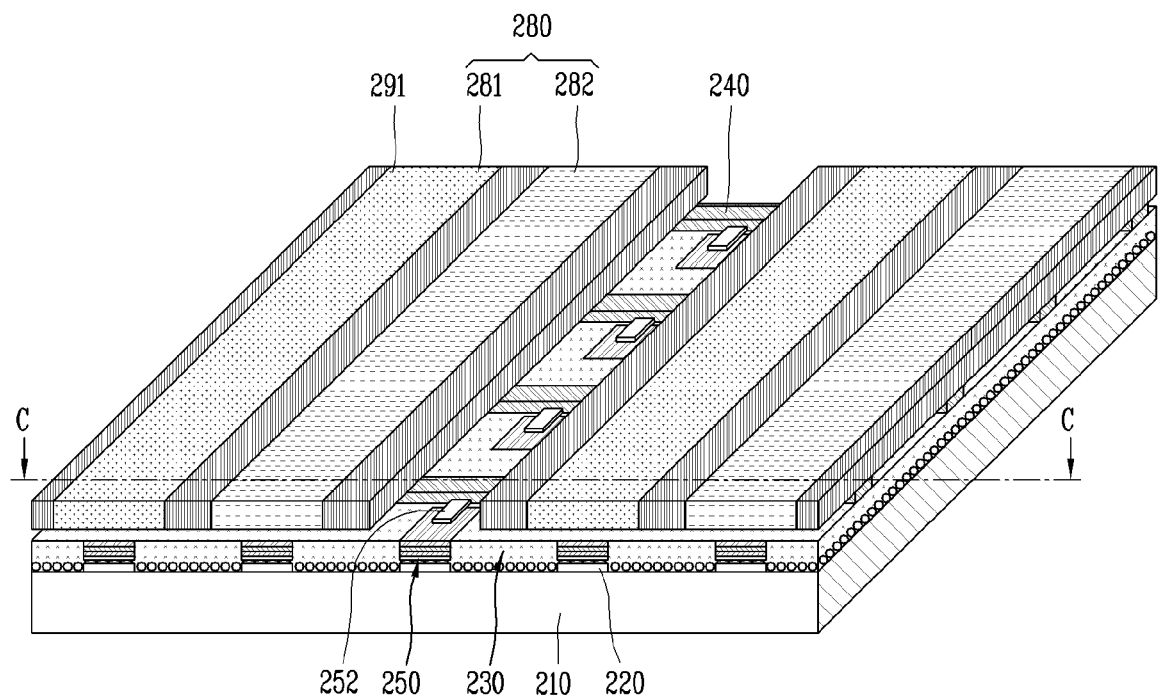
FIG. 7 is a perspective view showing a display apparatus using a semiconductor light emitting device according to another embodiment of the present disclosure.
Figure 8:
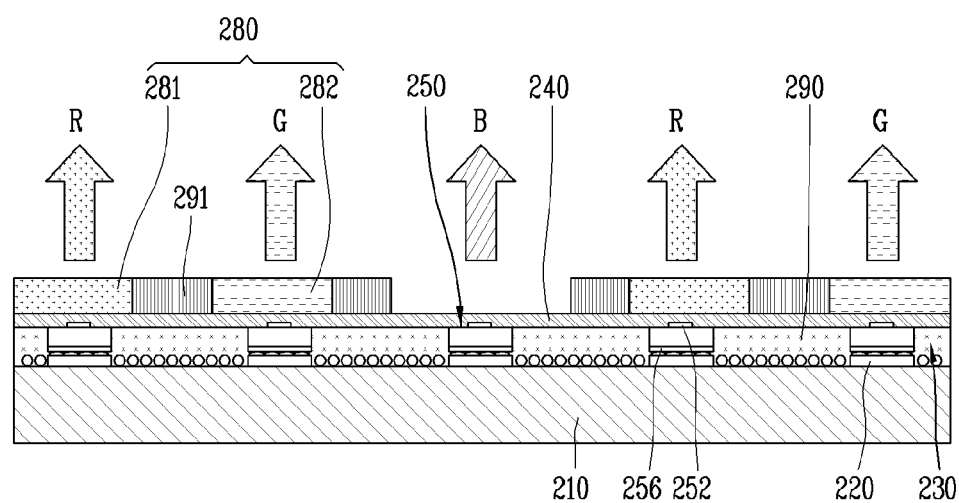
FIG. 8 is a cross-sectional view taken along line D-D in FIG. 7.
Figure 9:
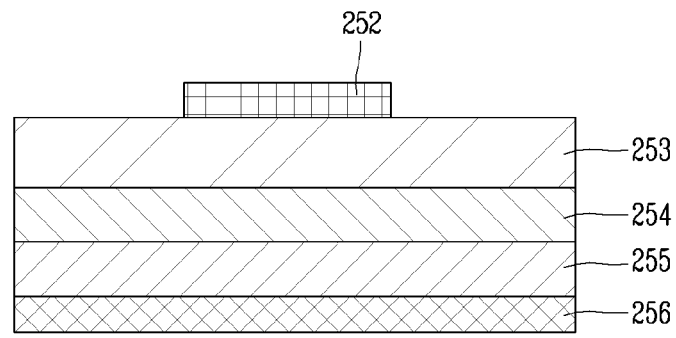
FIG. 9 is a conceptual view showing a vertical semiconductor light emitting device in FIG. 8.

FIG. 7 is a perspective view showing a display apparatus using a semiconductor light emitting device according to another embodiment of the present disclosure, FIG. 8 is a cross-sectional view taken along line C-C in FIG. 7, and FIG. 9 is a conceptual view showing a vertical type semiconductor light emitting device in FIG. 8.

According to the drawings, the display apparatus may be display apparatus using a passive matrix (PM) type of vertical semiconductor light emitting device.

The display apparatus may include a substrate 210, a first electrode 220, a conductive adhesive layer 230, a second electrode 240 and a plurality of semiconductor light emitting devices 250.

The substrate 210 as a wiring substrate disposed with the first electrode 220 may include polyimide (PI) to implement a flexible display apparatus. In addition, any one may be used if it is an insulating and flexible material.

The first electrode 220 may be located on the substrate 210, and formed with a bar-shaped electrode elongated in one direction. The first electrode 220 may be formed to perform the role of a data electrode.

The conductive adhesive layer 230 is formed on the substrate 210 located with the first electrode 220. Similar to a display apparatus to which a flip-chip type light emitting device is applied, the conductive adhesive layer 230 may be an anisotropic conductive film (ACF), an anisotropic conductive paste, a solution containing conductive particles, and the like. However, the present embodiment illustrates a case where the conductive adhesive layer 230 is implemented by an anisotropic conductive film.

When an anisotropic conductive film is located in a state that the first electrode 220 is located on the substrate 210, and then heat and pressure are applied to connect the semiconductor light emitting device 250 thereto, the semiconductor light emitting device 250 is electrically connected to the first electrode 220. At this time, the semiconductor light emitting device 250 may be preferably disposed on the first electrode 220.

The electrical connection is generated because an anisotropic conductive film partially has conductivity in the thickness direction when heat and pressure are applied as described above. Accordingly, the anisotropic conductive film is partitioned into a portion having conductivity and a portion having no conductivity in the thickness direction thereof.

Furthermore, the anisotropic conductive film contains an adhesive component, and thus the conductive adhesive layer 230 implements a mechanical coupling as well as an electrical coupling between the semiconductor light emitting device 250 and the first electrode 220.

As such, the semiconductor light emitting device 250 is positioned on the conductive adhesive layer 230, thereby constituting an individual pixel in the display apparatus. Since the semiconductor light emitting device 250 has excellent luminance, an individual sub-pixel may be defined even with a small size. A size of an individual semiconductor light emitting device 250 may have a side length of 80 µm or less, and may be a rectangular or square device. In case of a rectangular shaped element, the size thereof may be less than 20×80 µm.

The semiconductor light emitting device 250 may be a vertical structure.

A plurality of second electrodes 240 disposed in a direction of crossing the length direction of the first electrode 220, and electrically connected to the vertical semiconductor light emitting device 250 may be located between vertical semiconductor light emitting devices.

Referring to FIG. 9, the vertical semiconductor light emitting device may include a p-type electrode 256, a p-type semiconductor layer 255 formed with the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at the bottom thereof may be electrically connected to the first electrode 220 by the conductive adhesive layer 230, and the n-type electrode 252 located at the top thereof may be electrically connected to the second electrode 240 which will be described later. The electrodes may be disposed in the upward/downward direction in the vertical semiconductor light emitting device 250, thereby providing a great advantage capable of reducing the chip size.

Referring again to FIG. 8, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be deposited on the blue semiconductor light emitting device 251 at a position implementing a red sub-pixel, and a green phosphor 282 capable of converting blue light into green (G) light may be deposited on the blue semiconductor light emitting device 251 at a position implementing a green sub-pixel. Furthermore, only the blue semiconductor light emitting device 251 may be solely used at a location implementing a blue sub-pixel. In this case, the red (R), green (G) and blue (B) sub-pixels may implement one pixel.

However, the present disclosure may not be necessarily limited to this, and another structure for implementing blue, red and green may be also applicable thereto as described above in a display apparatus to which a flip-chip type light emitting device is applied.

Taking the present embodiment into consideration again, the second electrode 240 is located between the semiconductor light emitting devices 250, and electrically connected to the semiconductor light emitting devices 250. For example, the semiconductor light emitting devices 250 may be disposed in a plurality of rows, and the second electrode 240 may be located between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed with a bar-shaped electrode elongated in one direction, and disposed in a perpendicular direction to the first electrode.

Furthermore, the second electrode 240 may be electrically connected to the semiconductor light emitting device 250 by a connecting electrode protruded from the second electrode 240. More specifically, the connecting electrode may be an n-type electrode of the semiconductor light emitting device 250. For example, the n-type electrode is formed with an ohmic electrode for ohmic contact, and the second electrode covers at least a portion of the ohmic electrode by printing or deposition. Through this, the second electrode 240 may be electrically connected to the n-type electrode of the semiconductor light emitting device 250.

According to the drawing, the second electrode 240 may be located on the conductive adhesive layer 230. According to circumstances, a transparent insulating layer (not shown) containing silicon oxide ($SiO_x$) may be formed on the substrate 210 formed with the semiconductor light emitting device 250. When the transparent insulating layer is formed and then the second electrode 240 is placed thereon, the second electrode 240 may be located on the transparent insulating layer. Furthermore, the second electrode 240 may be formed to be separated from the conductive adhesive layer 230 or transparent insulating layer.

If a transparent electrode such as indium tin oxide (ITO) is used to locate the second electrode 240 on the semiconductor light emitting device 250, the ITO material has a problem of bad adhesiveness with an n-type semiconductor. Accordingly, the second electrode 240 may be placed between the semiconductor light emitting devices 250, thereby obtaining an advantage in which the transparent electrode is not required. Accordingly, an n-type semiconductor layer and a conductive material having a good adhesiveness may be used as a horizontal electrode without being restricted by the selection of a transparent material, thereby enhancing the light extraction efficiency.

According to the drawing, a partition wall 290 may be formed between the semiconductor light emitting devices 250. In other words, the partition wall 290 may be disposed between the vertical semiconductor light emitting devices 250 to isolate the semiconductor light emitting device 250 constituting individual pixels. In this case, the partition wall 290 may perform the role of dividing individual sub-pixels from one another, and be formed as an integral body with the conductive adhesive layer 230. For example, a base member of the anisotropic conductive film may form the partition wall when the semiconductor light emitting device 250 is inserted into the anisotropic conductive film.

Furthermore, when the base member of the anisotropic conductive film is black, the partition wall 290 may have reflective characteristics while at the same time increasing contrast with no additional black insulator.

For another example, a reflective partition wall may be separately provided with the partition wall 290. The partition wall 290 may include a black or white insulator according to the purpose of the display apparatus.

When the second electrode 240 is precisely located on the conductive adhesive layer 230 between the semiconductor light emitting devices 250, the partition wall 290 may be located between the vertical semiconductor light emitting device 250 and second electrode 240. Accordingly, individual sub-pixels may be configured even with a small size using the semiconductor light emitting device 250, and a distance between the semiconductor light emitting devices 250 may be relatively sufficiently large to place the second electrode 240 between the semiconductor light emitting devices 250, thereby having the effect of implementing a flexible display apparatus having a HD image quality.

Furthermore, according to the drawing, a black matrix 291 may be disposed between each phosphor layer to enhance contrast. In other words, the black matrix 291 may enhance the contrast of luminance.

As described above, the semiconductor light emitting device 250 is positioned on the conductive adhesive layer 230, thereby constituting an individual pixel in the display apparatus. Since the semiconductor light emitting device 250 has excellent luminance, an individual sub-pixel may be defined even with a small size. As a result, a full color display in which the sub-pixels of red (R), green (G) and blue (B) constitute one pixel may be implemented by means of the semiconductor light emitting devices.

An anisotropic conductive film (ACF) is used in a display apparatus described above. The anisotropic conductive film (hereinafter, anisotropic conductive layer) is made of a mixture of conductive balls (hereinafter, conductive particles) and an insulating material. As described with reference to FIG. 6, when a substrate on which the semiconductor light emitting device is formed is thermally compressed to a wiring substrate coated with an anisotropic conductive layer, the wiring electrode and the semiconductor light emitting device are electrically connected by conductive particles.

During thermal compression, the conductive particles are compressed between the semiconductor light emitting device and the wiring electrode to electrically connect the semiconductor light emitting device and the wiring electrode. In order for the semiconductor light emitting device and the wiring electrode to be electrically connected, pressure above a predetermine level must be applied to conductive particles.

Figure 10:
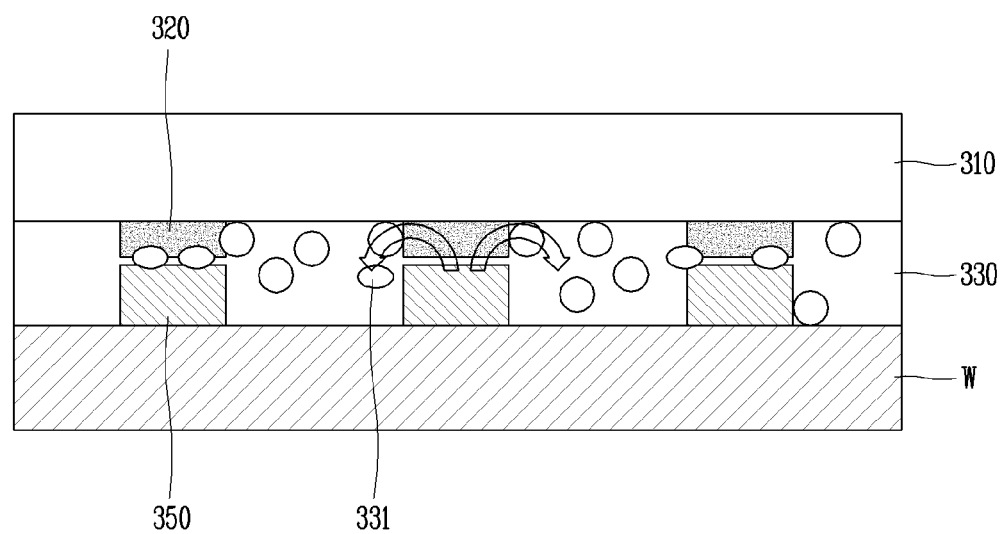
FIGS. 10 and 11 are conceptual views showing a problem occurring during pressing described in FIG. 6.

Referring to FIG. 10, during thermal compression, a contact failure between a semiconductor light emitting device 350 and a wiring electrode 320 may occur due to the fluidity of an anisotropic conductive layer 330. Specifically, during thermal compression, the conductive particles 331 must be located between the semiconductor light emitting device 350 and the wiring electrode 320, but due to external pressure, the conductive particles 331 may move without staying in between the semiconductor light emitting device 350 and the wiring electrode. In this case, the semiconductor light emitting device 350 and the wiring electrode 320 are incompletely electrically connected.

Figure 11:
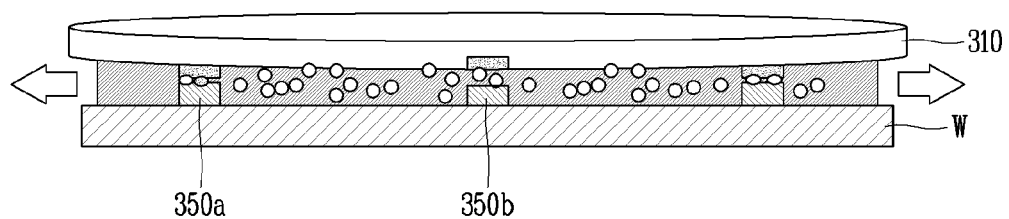

On the other hand, referring to FIG. 11, as an area of the wiring substrate 310 increases, pressure applied to each region of the wiring substrate 110 during thermal compression becomes non-uniform. Specifically, when the area of the wiring substrate is large, relatively high pressure is applied to an edge region of the wiring substrate, and a relatively low pressure is applied to a central region of the wiring substrate. Due to this, the conductive particles are completely pressed to the wiring electrode and the semiconductor light emitting device in the edge region of the wiring substrate, but sufficient pressure is not applied to the conductive particles in the central region of the wiring substrate, thereby resulting in poor contact between the wiring electrode and the semiconductor light emitting device.

The present disclosure provides a structure of preventing conductive particles from being released between the semiconductor light emitting device and allowing uniform pressure to be applied to an entire wiring substrate during the foregoing thermal compression, and a manufacturing method thereof.

First, a method of manufacturing a display apparatus according to the present disclosure will be described.

FIGS. 12 to 16 are conceptual views showing a method of manufacturing a display apparatus according to an embodiment of the present disclosure.

First, forming the plurality of semiconductor light emitting devices 350 on the growth substrate (W) is carried out.

Figure 12A:
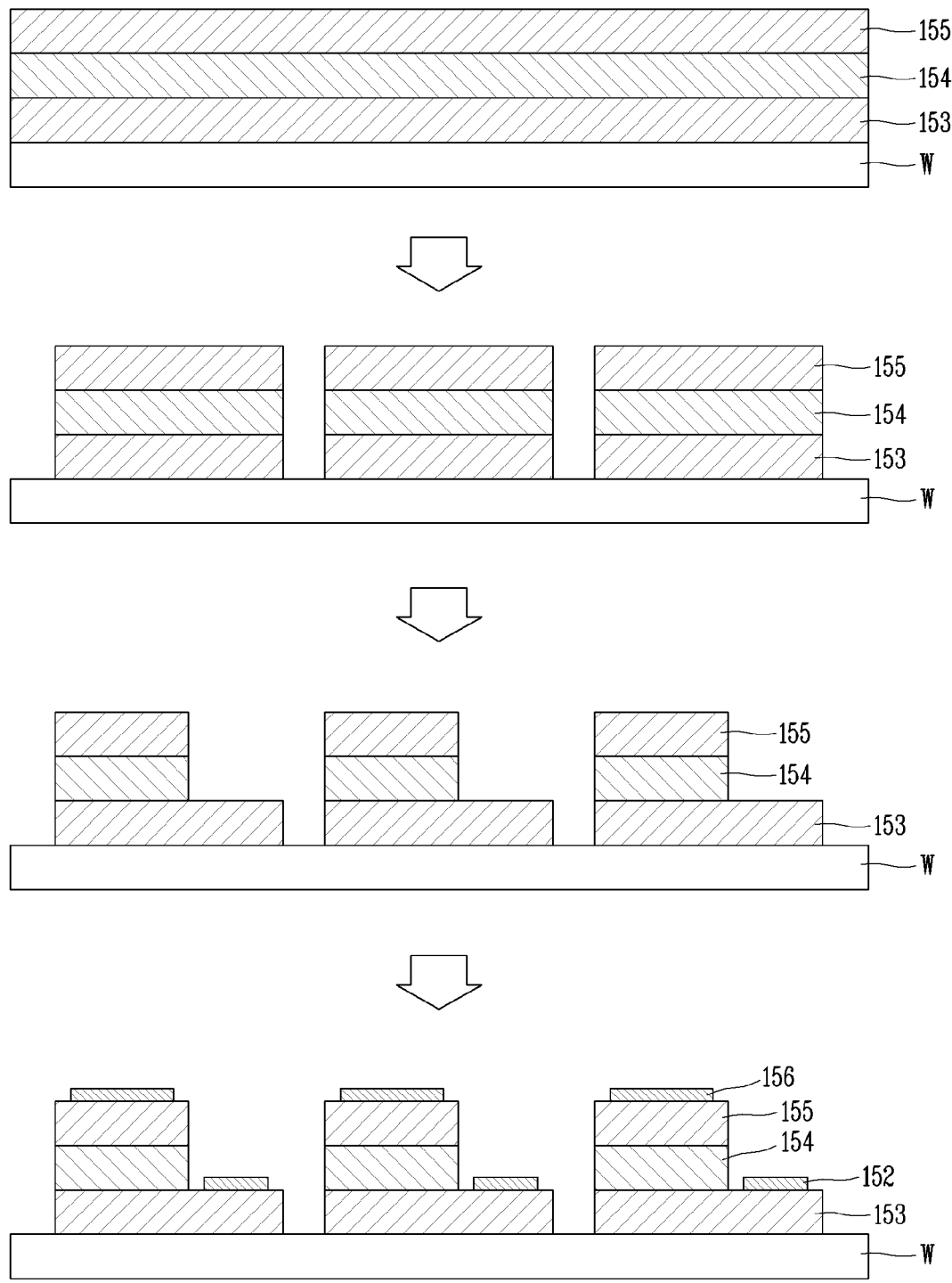
FIGS. 12A to 16 are conceptual views showing a method of manufacturing a display apparatus according to an embodiment of the present disclosure.

Referring to FIG. 12A, conductive semiconductor layers grown on the growth substrate (W) may be manufactured as individual semiconductor light emitting devices through isolation and mesa processes. Since a process of forming the semiconductor light emitting device is a known technology, and thus a detailed description thereof will be omitted.

Then, forming a conductive electrode on the semiconductor light emitting device is carried out.

A position at which the conductive electrode is formed may vary depending on the type of the semiconductor light emitting device. In this specification, a flip-chip type semiconductor light emitting device will be described as an example, but the present disclosure is not limited to the flip-chip type and may be applicable to all types of semiconductor light emitting devices.

Referring to FIG. 12A, in the case of a flip-chip type semiconductor light emitting device, the semiconductor light emitting device is formed on the growth substrate (W), and then two conductive electrodes 152, 156 are formed on each semiconductor light emitting device. The conductive electrodes 152, 156 may be formed by a deposition method, but a method of forming the conductive electrodes 152, 156 is not specifically limited.

Then, a step of forming the adhesive layer 330 on the semiconductor light emitting device is carried out. The step of forming the adhesive layer 330 may be largely performed in two ways.

Figure 12B:
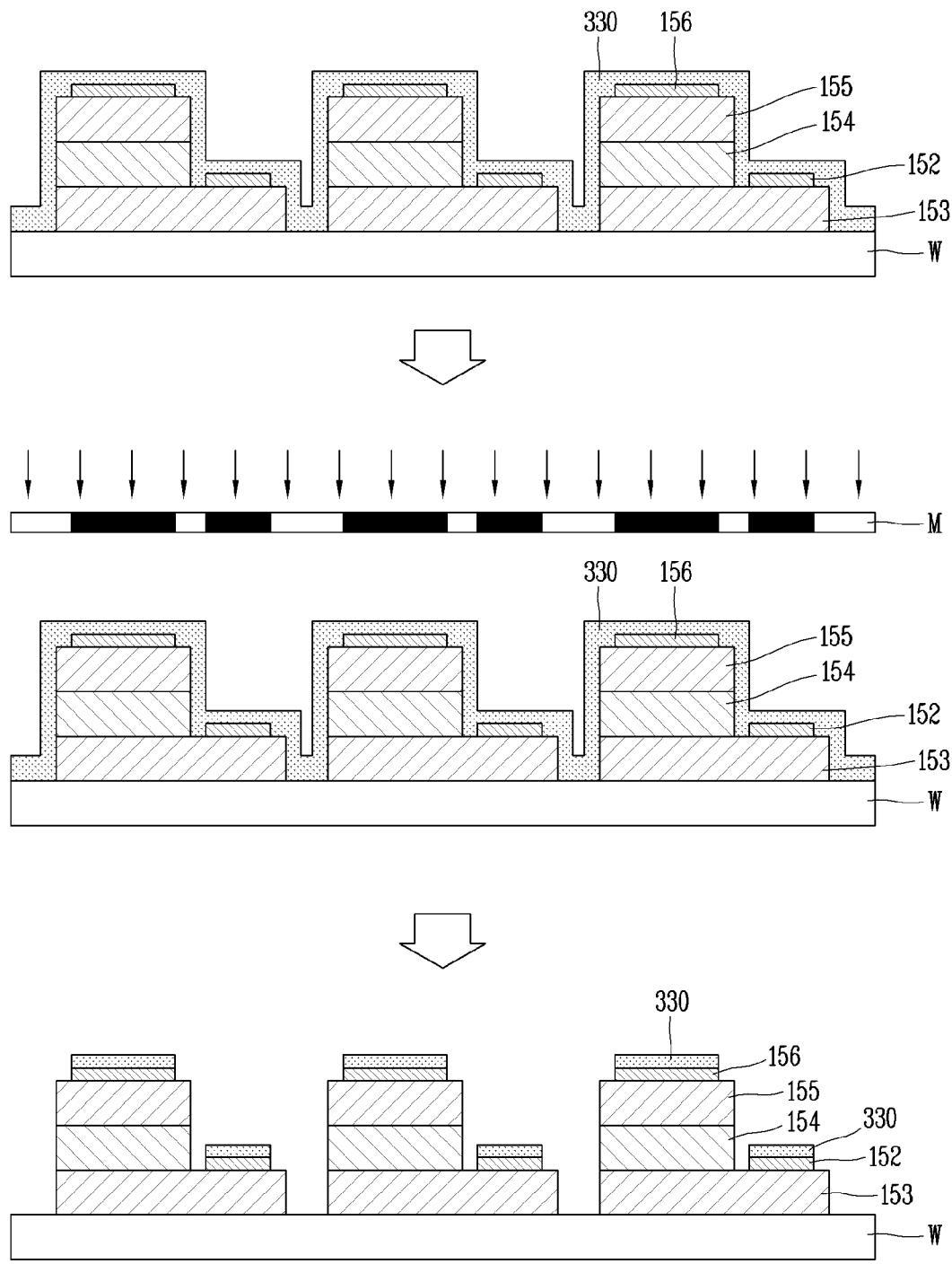

First, the step may be performed in a manner of selectively forming the adhesive layer 330 only on surfaces of the conductive electrodes 152, 156. To this end, as shown in FIG. 12B, the step may be performed in a manner of entirely applying the adhesive layer onto the semiconductor light emitting device, and then etching unnecessary portions. As a result, the adhesive layer 330 may be selectively formed only on a surface of the conductive electrode.

Second, the step may be performed in a manner of applying the adhesive layer as a whole on a surface of the semiconductor light emitting device. In this case, the step of forming the adhesive layer may include a plurality of steps.

Figure 12C:
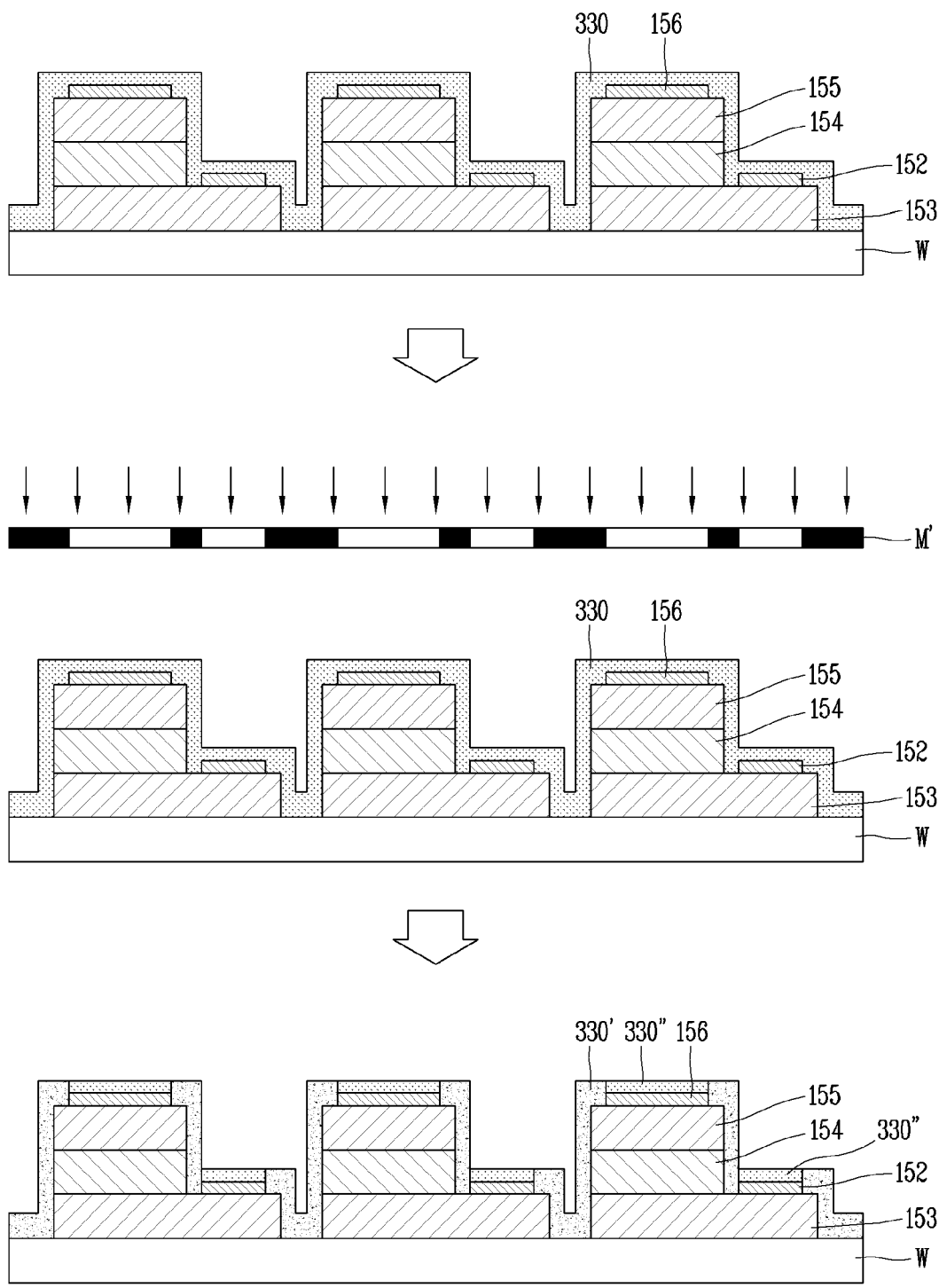
Figure 12D:
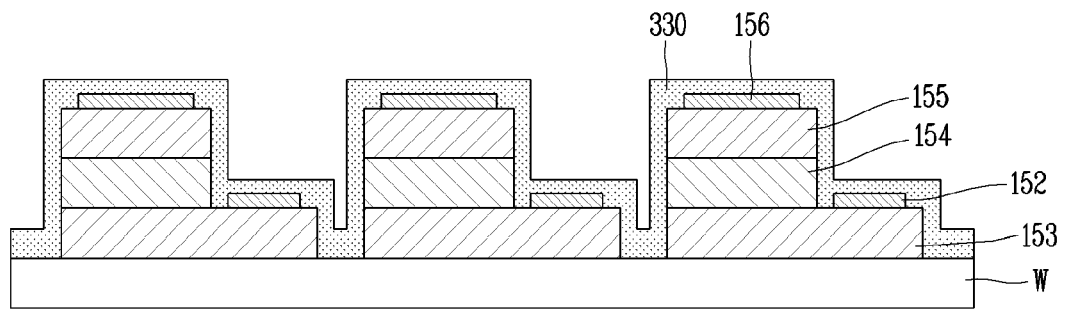
Figure 12D:
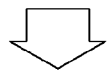
Figure 12D:
Figure 12D:
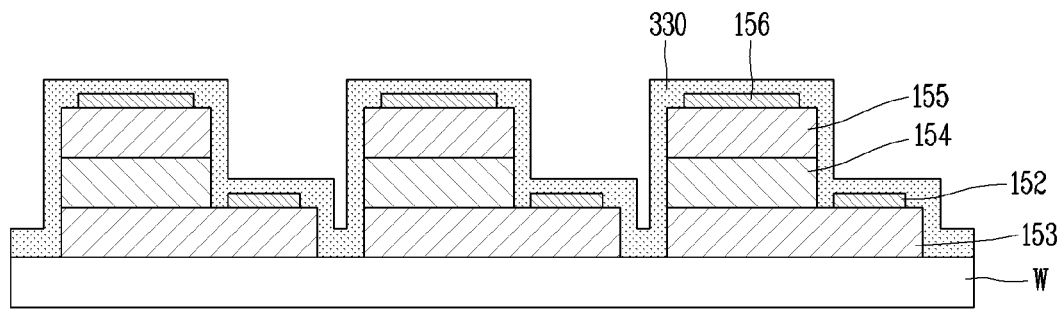
Figure 12D:
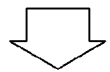
Figure 12D:
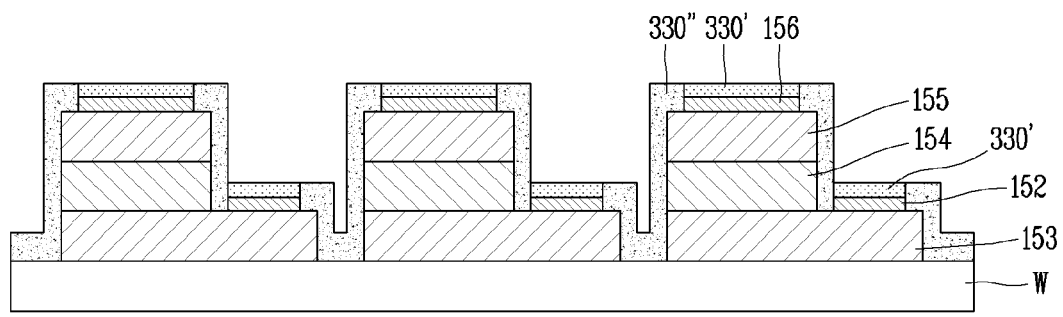

Specifically, referring to FIGS. 12C and 12D, the step of forming the adhesive layer on the semiconductor light emitting device may include forming the adhesive layer 330 on a surface of the conductive electrode and a surface of the semiconductor light emitting device that is not covered with the conductive electrode, and selectively irradiating light only to a portion 330" of the adhesive layer such that the portion of the adhesive layer is cured.

In this case, in the step of selectively irradiating light only to the portion 330" of the adhesive layer, light may be selectively irradiated only to the adhesive layer formed on the surface of the semiconductor light emitting device that is not covered with the conductive electrode, or light may be selectively irradiated only to the adhesive layer formed on the surface of the conductive electrode.

Among compositions constituting the adhesive layer, there may be a constituent material that loses adhesion or increases adhesion when irradiating light at a specific wavelength. By using such a composition, adhesion can be maintained in a desired region.

Among characteristics of a negative PR, there is a characteristic of being liquefied from a solid when low heat (100° C.) is applied to a non-photocured region after softbaking. In this case, the liquefied region has a lower viscosity compared to a non-liquefied region, which may cause the material applied on the adhesive layer to sink into the adhesive layer. Then, when the adhesive layer is cooled, the material sunk into the adhesive layer may be strongly fixed to the adhesive layer.

Figure 12E:
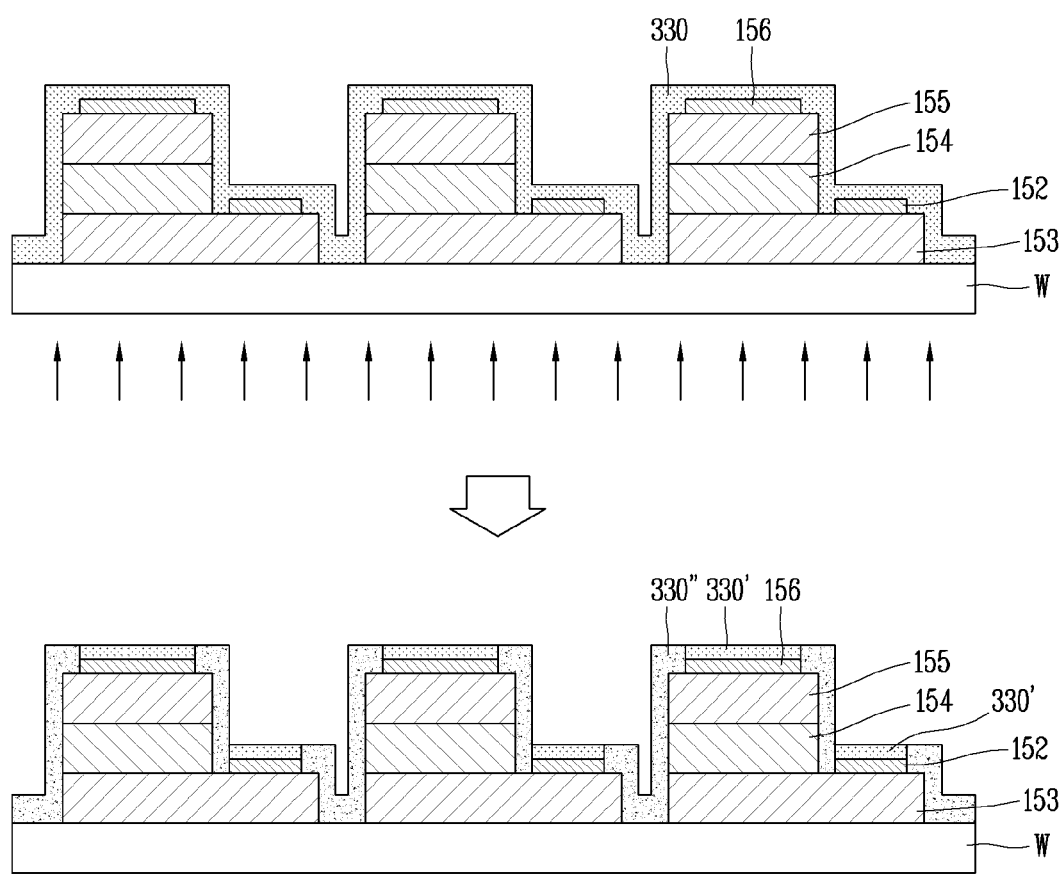

In an embodiment, referring to FIG. 12E, when light is irradiated from one surface side of a growth substrate on which a semiconductor light emitting device is not disposed during the application of negative PR, the conductive electrode disposed on the semiconductor light emitting device may serve as a mask, and thus light may not be irradiated only to the adhesive layer disposed on the surface of the conductive electrode. By using this, a PR process can be performed without a separate mask.

Meanwhile, the adhesive layer may be formed to a thickness of less than 1 μm, but is not limited thereto. A thickness of the adhesive layer may vary depending on a structure of the semiconductor light emitting device and a size of conductive particles to be described later.

Figure 13:
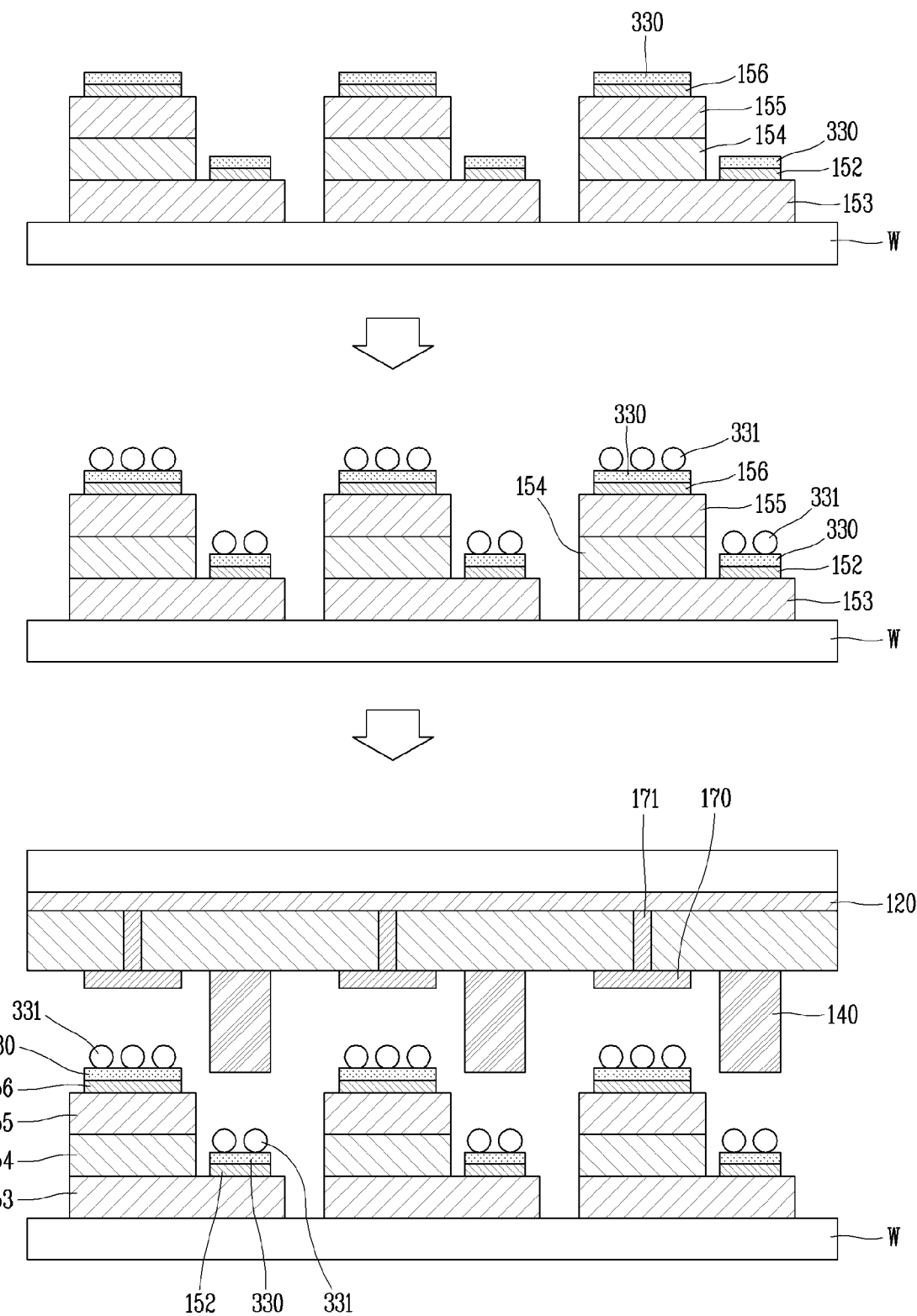

Then, referring to FIG. 13, a step of applying the conductive particles 331 onto the adhesive layer is carried out.

When the adhesive layer is selectively formed only on the conductive electrode, conductive particles are disposed only on the conductive electrode and do not adhere to the other region.

On the other hand, when conductive particles are applied while an adhesion in a partial region of the adhesive layer applied to an entire semiconductor light emitting device is higher than that of the remaining region or a viscosity of the partial region is lower than that of the remaining region, the conductive particles will selectively adhere to the region with a higher adhesion or the region with a lower viscosity.

Specifically, when the adhesion of the adhesive layer decreases when irradiating light at a specific wavelength to the adhesive layer, light may be selectively irradiated only to the adhesive layer formed on a surface of the semiconductor light emitting device that is not covered with the conductive electrode, thereby relatively increasing the adhesion of the adhesive layer formed on a surface of the conductive electrode.

On the contrary, when the adhesion of the adhesive layer increases when irradiating light at a specific wavelength to the adhesive layer, light may be selectively irradiated only to the adhesive layer that is covered with the conductive electrode, thereby relatively increasing the adhesion of the adhesive layer formed on a surface of the conductive electrode.

On the other hand, when the adhesive layer is made of a material whose viscosity decreases when low heat is applied while light is not irradiated, light may be selectively irradiated only to the adhesive layer formed on the surface of the semiconductor light emitting device that is not covered with the conductive electrode, and then low heat may be applied. Accordingly, a viscosity of the adhesive layer that is covered with the conductive electrode is relatively reduced.

When conductive particles are applied in the foregoing state, the conductive particles are selectively adhered only to the conductive electrode. Through this, the present disclosure allows the conductive particles to be selectively disposed only on the conductive electrode.

The conductive particles are conductive materials, and may be made of Sn, Au, In, Pb, and Bi, or a metal mixed with at least some of the foregoing metals. However, the present disclosure is not limited thereto, and the conductive particles may be a conductive material that can be deformed when transferring a semiconductor light emitting device at a temperature of about 300° C.

Meanwhile, a particle diameter of the conductive particles may be within 10 μm, but is not limited thereto. The particle diameter of the conductive particles may vary depending on a size of the semiconductor light emitting device and the area of the conductive electrode.

Figure 14:
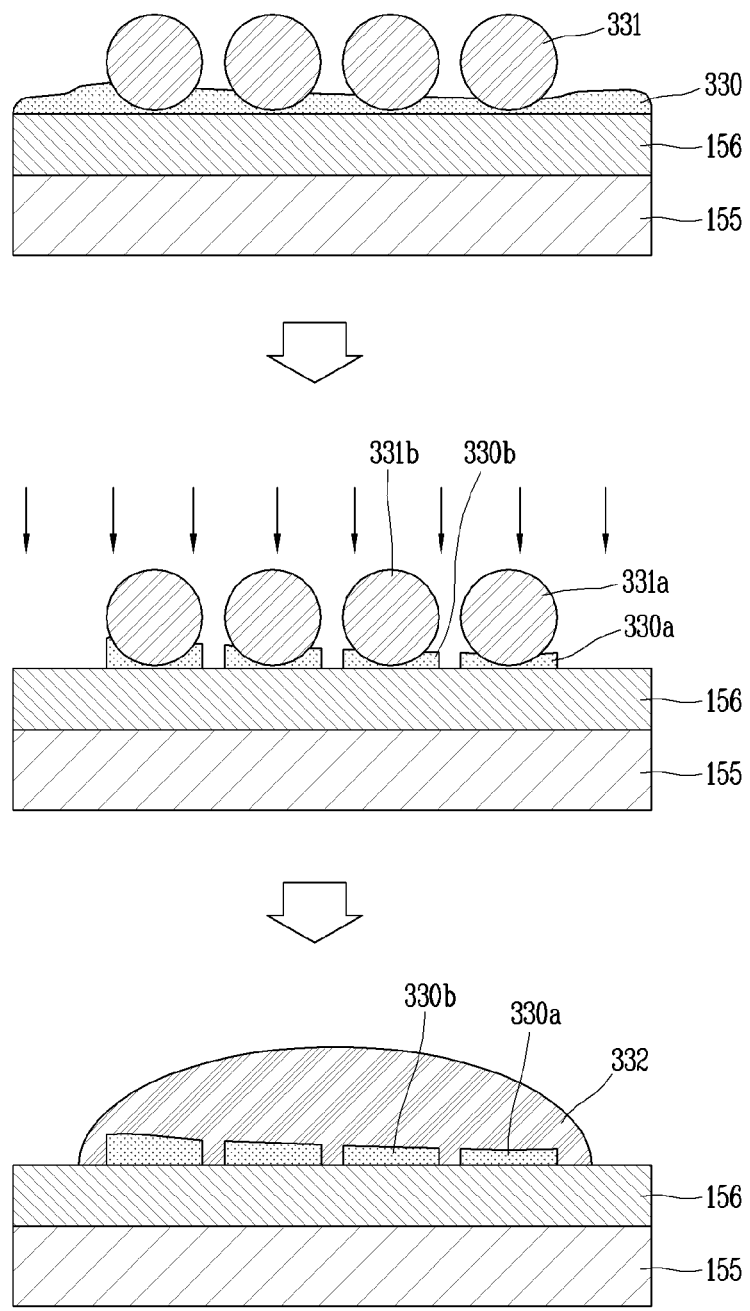

On the other hand, referring to FIG. 14, after the conductive particles are applied, a partial region of the adhesive layer to which the conductive particles are not applied may be removed through dry etching. In this case, the conductive particles may serve as a mask. As a result of the etching, a plurality of adhesive layers 330a, 330b spaced apart from each other may be formed on a surface of one conductive electrode 156. Through this, according to the present disclosure, a distance through which the conductive particles 331a, 331b can flow on the adhesive layer may be minimized when the semiconductor light emitting device is transferred. In addition, after forming the plurality of adhesive layers 330a, 330b on the conductive electrode 156, heat may be applied to melt the conductive particles 331a, 331b. Accordingly, the plurality of conductive particles are combined into one to form a lump 332, and are strongly fixed on the conductive electrode 156. The lump serves to electrically connect the semiconductor light emitting device to the wiring substrate when transferring the semiconductor light emitting device.

Referring again to FIG. 13, a step of transferring the semiconductor light emitting device onto a substrate on which the wiring electrode is formed is carried out.

In the transfer step, the conductive particles 331 are pressed to electrically connect the conductive electrodes 152, 156 and the wiring electrodes 140, 170. According to the present disclosure, since the flow of the anisotropic conductive layer is minimized, there is a very low possibility that the conductive particles 331 are released from a position between the conductive electrodes 152, 156 and the wiring electrodes 140, 170 in the transfer step.

The step of transferring the semiconductor light emitting device onto a substrate on which the wiring electrode is formed may be performed by aligning the growth substrate and the substrate such that the conductive electrode overlaps the wiring electrode, and then pressing the growth substrate to the substrate.

This transfer step may be performed at a temperature of about 300° C., but is not necessarily limited thereto.

Figure 15:
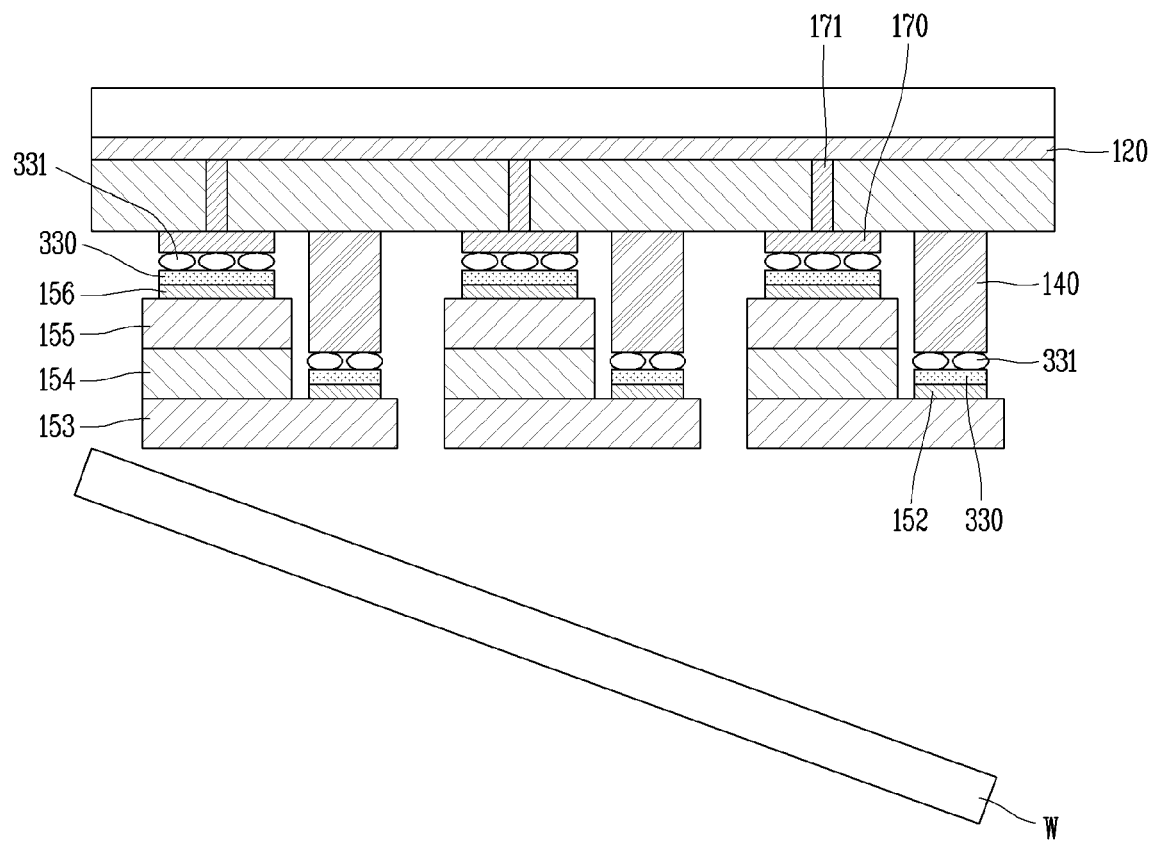

Next, referring to FIG. 15, a step of removing the growth substrate (W) is carried out. The growth substrate (W) may be removed by a laser lift-off method, but is not limited thereto.

As described above, in the present disclosure, unlike an ACF in the related art, conductive particles are disposed only on a surface of the conductive electrode, thereby preventing the conductive particles from being released from a predetermined position when transferring the semiconductor light emitting device.

Figure 16:
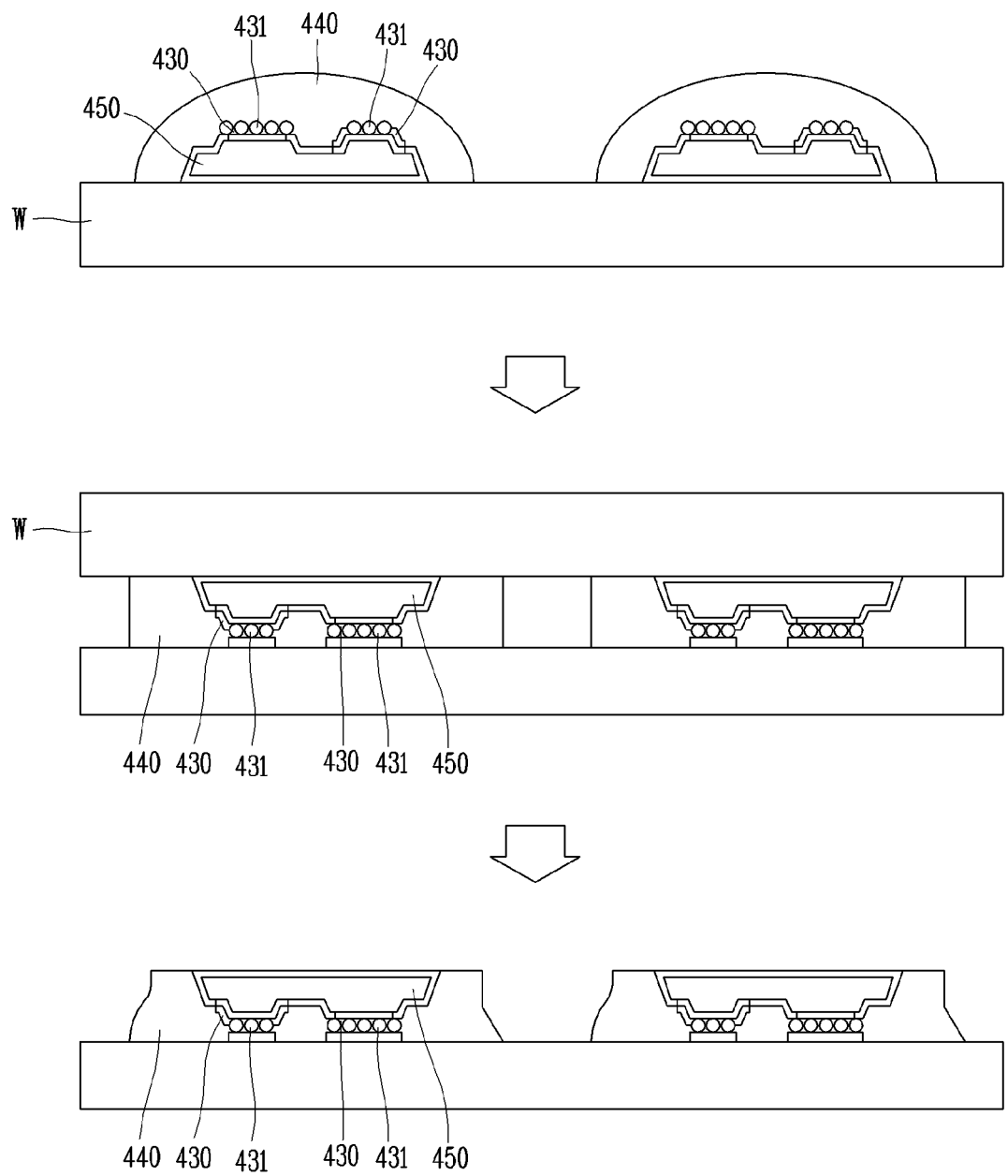

On the other hand, referring to FIG. 16, after the conductive particles 431 are applied to the semiconductor light emitting device 450, a non-conductive paste 440 for bonding the wiring substrate may be applied onto the growth substrate (W). The non-conductive paste 440 may be selectively applied only onto the semiconductor light emitting device.

Then, when the semiconductor light emitting device 450 is transferred, the non-conductive paste 440 acts as a buffer for a pressure applied by the growth substrate (W), thereby preventing the semiconductor light emitting device 450 from being damaged when the semiconductor light emitting device 450 is transferred. At this time, since the conductive particles 431 are strongly fixed to the adhesive layer 430, there is a very low possibility that the semiconductor light emitting device 450 is released into non-conductive particles.

When nanoparticles are added to the non-conductive paste 440, a reflectance at a side surface of the semiconductor light emitting device 450 is increased to increase an amount of light of the display apparatus. Hereinafter, a structure of a display apparatus according to the foregoing manufacturing method will be described.

Figure 17A:
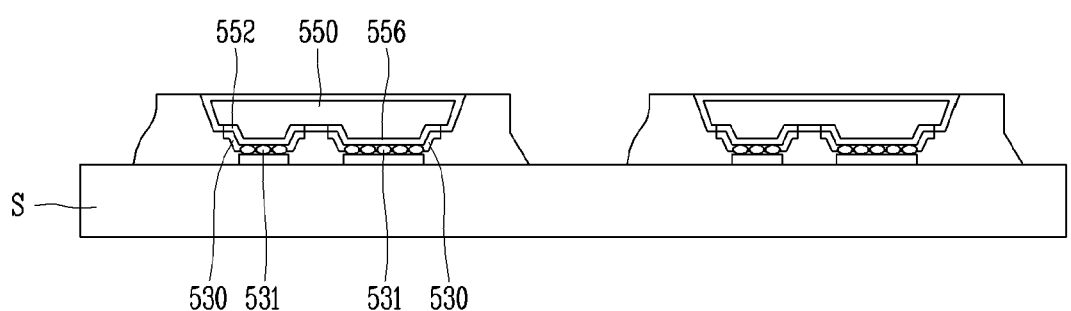
FIGS. 17A and 17B are cross-sectional views of a display apparatus according to an embodiment of the present disclosure.
Figure 17B:
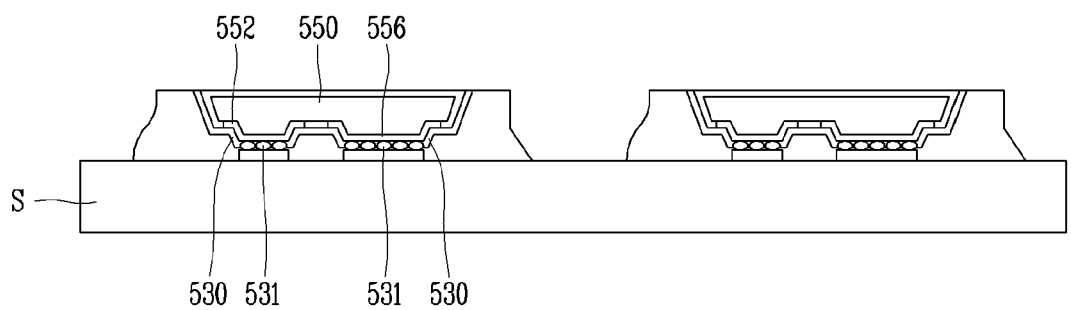

FIGS. 17A and 17B are cross-sectional views showing a cross-section of a display apparatus according to the present disclosure.

Referring to FIGS. 17A and 17B, the display apparatus according to the present disclosure includes a substrate, a wiring electrode, a plurality of semiconductor light emitting devices, a plurality of conductive particles, and an adhesive layer.

A substrate (S) is the same as the substrate described with reference to FIGS. 1 to 9, and thus a detailed description thereof will be omitted.

A plurality of wiring electrodes may be disposed on the substrate. The plurality of conductive particles electrically connect the plurality of wiring electrodes disposed on the substrate to the semiconductor light emitting devices.

The conductive particles 531 are deformed in shape by a pressure applied during a transfer process of the semiconductor light emitting device 550 to electrically connect the wiring electrode to the conductive electrodes 552 and 556. The conductive particles 531 are selectively fixed only to surfaces of the conductive electrodes 552 and 556.

Meanwhile, the adhesive layer may be disposed in two types.

First, as shown in FIG. 17A, the adhesive layer 530 may be selectively disposed only on the surfaces of the conductive electrodes 552 and 556. As described above, after the adhesive layer 530 is formed, the adhesive layer may be disposed only on the surfaces of the conductive electrodes through partial etching.

Through this, the present disclosure prevents the conductive particles from leaving the conductive electrodes when transferring the semiconductor light emitting device.

Furthermore, a plurality of adhesive layers spaced apart from each other may be disposed on the surface of the conductive electrodes. At least one conductive particle may be disposed on each of the plurality of adhesive layers.

Since the plurality of adhesive layers spaced apart from each other extremely restrict the flow of the conductive particles, it may be possible to strongly fix the conductive particles to their original positions when transferring the semiconductor light emitting device.

On the other hand, referring to FIG. 17B, the adhesive layer 530 may be evenly formed on the semiconductor light emitting device. Specifically, the adhesive layer 530 may be formed on a surface of the conductive electrode and a surface of the semiconductor light emitting device that is not covered with the conductive electrode.

In this case, over an entire region of the adhesive layer 530, an adhesion of a region disposed on the surface of the conductive electrode may be greater than that of a region disposed on the surface of the semiconductor light emitting device that is not covered with the conductive electrode.

As described in the manufacturing method, in the present disclosure, the conductive particles may be fixed only at a designated position by losing or enhancing the adhesion at a portion of the adhesive layer.

Meanwhile, the viscosity of a region disposed on a surface of the conductive electrode over an entire region of the adhesive layer may be lower than that of a region disposed on a surface of the semiconductor light emitting device that is not covered with the conductive electrode. Accordingly, when transferring the semiconductor light emitting device, the conductive particles flow only on the surface of the conductive electrode, and do not leave the surface of the conductive electrode.

As described above, the present disclosure allows the conductive particles to be fixed only at a designated position even when the adhesive layer is not selectively disposed only on the conductive electrode, and prevents the conductive particles from leaving the conductive electrode when transferring the semiconductor light emitting device.

The configurations and methods according to the above-described embodiments will not be applicable in a limited way to the foregoing display apparatus using a semiconductor light emitting device, and all or part of each embodiment may be selectively combined and configured to make various modifications thereto.

What is claimed is:

1. A display apparatus comprising:
   a substrate;
   a wiring electrode disposed on the substrate;
   a plurality of semiconductor light emitting devices electrically connected to the wiring electrode;
   a plurality of conductive particles disposed between the wire electrode and the plurality of semiconductor light emitting devices; and
   an adhesive layer disposed on each of the plurality of semiconductor light emitting devices to fix the plurality of conductive particles to corresponding ones of the plurality of semiconductor light emitting devices, wherein each of the plurality of semiconductor light emitting devices comprises a plurality of conductive electrodes, and each of the plurality of conductive particles are selectively fixed only to surfaces of corresponding ones of the plurality of conductive electrodes, and wherein a plurality of adhesive layers spaced apart from each other are disposed on a surface of each of the plurality of conductive electrodes, and at least one of the plurality of conductive particles is fixed to each of the plurality of adhesive layers.

2. The display apparatus of claim 1, wherein the adhesive layer is selectively disposed only on surfaces of the plurality of conductive electrodes.

3. The display apparatus of claim 1, wherein one of the plurality of adhesive layers is disposed on a surface of a corresponding one of the plurality of conductive electrodes and a surface of a corresponding one of the semiconductor light emitting devices that is not covered with any of the plurality of conductive electrodes.

4. The display apparatus of claim 3, wherein an adhesion of a region disposed on the surface of each of the plurality of conductive electrodes over an entire region of the adhesive layer is greater than that of a region disposed on the surface of corresponding one of the semiconductor light emitting devices that is not covered with any of the plurality of conductive electrodes.

5. The display apparatus of claim 3, wherein a viscosity of a region disposed on a surface of each of the plurality conductive electrodes over an entire region of the adhesive layer is less than that of a region disposed on the surface of the corresponding one of the semiconductor light emitting devices that is not covered with any of the plurality of conductive electrodes.

* * * * *